(12) United States Patent
Lee et al.

(10) Patent No.: US 10,896,884 B2
(45) Date of Patent: Jan. 19, 2021

(54) SEMICONDUCTOR PACKAGE AND ANTENNA MODULE INCLUDING THE SAME

(71) Applicant: SAMSUNG ELECTRONICS CO., LTD., Suwon-si (KR)

(72) Inventors: Yong Koon Lee, Suwon-si (KR); Jin Su Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/281,819

(22) Filed: Feb. 21, 2019

(65) Prior Publication Data
US 2020/0066662 A1    Feb. 27, 2020

(30) Foreign Application Priority Data
Aug. 22, 2018   (KR) .................. 10-2018-0097952

(51) Int. Cl.
    *H01L 23/66*       (2006.01)
    *H01L 23/552*     (2006.01)
    (Continued)

(52) U.S. Cl.
    CPC ........ *H01L 23/66* (2013.01); *H01L 23/49517* (2013.01); *H01L 23/49575* (2013.01);
    (Continued)

(58) Field of Classification Search
    CPC ... H01L 23/66; H01L 23/552; H01L 23/5384; H01L 23/5385; H01L 23/49575;
    (Continued)

(56) References Cited

U.S. PATENT DOCUMENTS

| | | | |
|---|---|---|---|
| 2007/0013396 A1* | 1/2007 | Kim | ..................... G06K 19/077 361/767 |
| 2010/0052188 A1* | 3/2010 | Khan | ..................... H01L 23/16 257/778 |
| 2013/0154066 A1 | 6/2013 | Kim et al. | |
| 2017/0103951 A1 | 4/2017 | Lee et al. | |

(Continued)

FOREIGN PATENT DOCUMENTS

| KR | 10-2013-0115446 A | 10/2013 |
|---|---|---|
| KR | 10-2017-0067947 A | 6/2017 |

(Continued)

*Primary Examiner* — Yasser A Abdelaziez
(74) *Attorney, Agent, or Firm* — Sughrue Mion, PLLC

(57) ABSTRACT

A semiconductor package includes a frame having a first through-hole, a semiconductor chip having an active surface on which a connection pad is disposed; a first encapsulant encapsulating at least a portion of the semiconductor chip; a second encapsulant disposed on at least a portion of the external side surface of the frame, and a connection member disposed on the active surface of the semiconductor chip and including a redistribution layer electrically connected to the connection pad of the semiconductor chip. The frame includes an insulating layer, a wiring layer disposed on upper and lower surfaces of the insulating layer, a first metal layer on the external side wall of the insulating layer, a second metal layer on the internal side wall of the first through hole, and a via penetrating the upper and lower surfaces of the insulating layer.

16 Claims, 19 Drawing Sheets

(51) Int. Cl.
*H01L 23/538* (2006.01)
*H01L 23/495* (2006.01)
*H01Q 1/22* (2006.01)

(52) U.S. Cl.
CPC ...... *H01L 23/5384* (2013.01); *H01L 23/5385* (2013.01); *H01L 23/5386* (2013.01); *H01L 23/552* (2013.01); *H01Q 1/2283* (2013.01)

(58) Field of Classification Search
CPC .......... H01L 23/49517; H01L 23/5389; H01L 2224/18; H01L 23/5383; H01L 23/481; H01L 23/485; H01L 23/62; H01L 23/3135; H01L 23/5386; H01L 2223/6677; H01Q 1/2283; H01Q 9/0414; H01Q 23/00; H01Q 1/242; H01Q 1/526
See application file for complete search history.

(56) References Cited

U.S. PATENT DOCUMENTS

| | | |
|---|---|---|
| 2017/0162516 A1 | 6/2017 | Joh |
| 2017/0287825 A1* | 10/2017 | Lee .................... H01L 21/56 |
| 2018/0182691 A1 | 6/2018 | Cho et al. |
| 2018/0197831 A1 | 7/2018 | Kim et al. |
| 2018/0226366 A1 | 8/2018 | Kim et al. |
| 2018/0350747 A1 | 12/2018 | Hwang et al. |

FOREIGN PATENT DOCUMENTS

| | | |
|---|---|---|
| KR | 10-2018-0064743 A | 6/2018 |
| KR | 10-1872644 B1 | 6/2018 |
| KR | 10-2018-0073371 A | 7/2018 |
| KR | 10-2018-0090527 A | 8/2018 |
| TW | 201724414 A | 7/2017 |
| WO | 2017111768 A1 | 6/2017 |

* cited by examiner

SEMICONDUCTOR PACKAGE AND ANTENNA MODULE INCLUDING THE SAME

CROSS-REFERENCE TO RELATED APPLICATION(S)

This application claims the benefit of priority to Korean Patent Application No. 10-2018-0097952 filed on Aug. 22, 2018 with the Korean Intellectual Property Office, the disclosure of which is incorporated herein by reference in its entirety.

TECHNICAL FIELD

The present disclosure relates to a semiconductor package and an antenna module including the same.

BACKGROUND

In recent years, with the trend for high performance in electronic devices, various components mounted on mobile devices such as smartphones have been used at higher frequencies and bandwidths are increasing. Particularly, in the case of an antenna module for mm-Wave and 5G communications, it is necessary to significantly reduce mutual interference between the components in the antenna module together with miniaturization. Accordingly, even in the semiconductor package mounted on the antenna module, it is necessary to have various electromagnetic wave shielding structures to realize excellent shielding characteristics against electromagnetic interference (EMI).

SUMMARY

An aspect of the present disclosure may provide a semiconductor package and an antenna module including the same in which mutual interference is eliminated by enhancing electrical shielding between a through via, through which a high frequency signal or high speed data passes, and a semiconductor chip.

According to an aspect of the present disclosure, in a semiconductor package and an antenna module including the same, a metal layer is disposed on an entire surface of a frame disposed in a semiconductor package.

For example, according to an aspect of the present disclosure, a semiconductor package includes a frame having a first through-hole; a semiconductor chip disposed in the first through-hole of the frame and having an active surface on which a connection pad is disposed and an inactive surface disposed on an opposite side of the active surface; a first encapsulant encapsulating at least a portion of the semiconductor chip, a second encapsulant disposed on a portion of an external side wall of the frame; and a connection member disposed on the active surface of the semiconductor chip and including a redistribution layer electrically connected to the connection pad of the semiconductor chip. The frame includes an insulating layer, a wiring layer on upper and lower surfaces of the insulating layer, a first metal layer on an external side wall of the insulating layer, a second metal layer on an internal side wall of the first through-hole, and a via penetrating the upper and lower surfaces of the insulating layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. The terms "first," "second," etc. may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
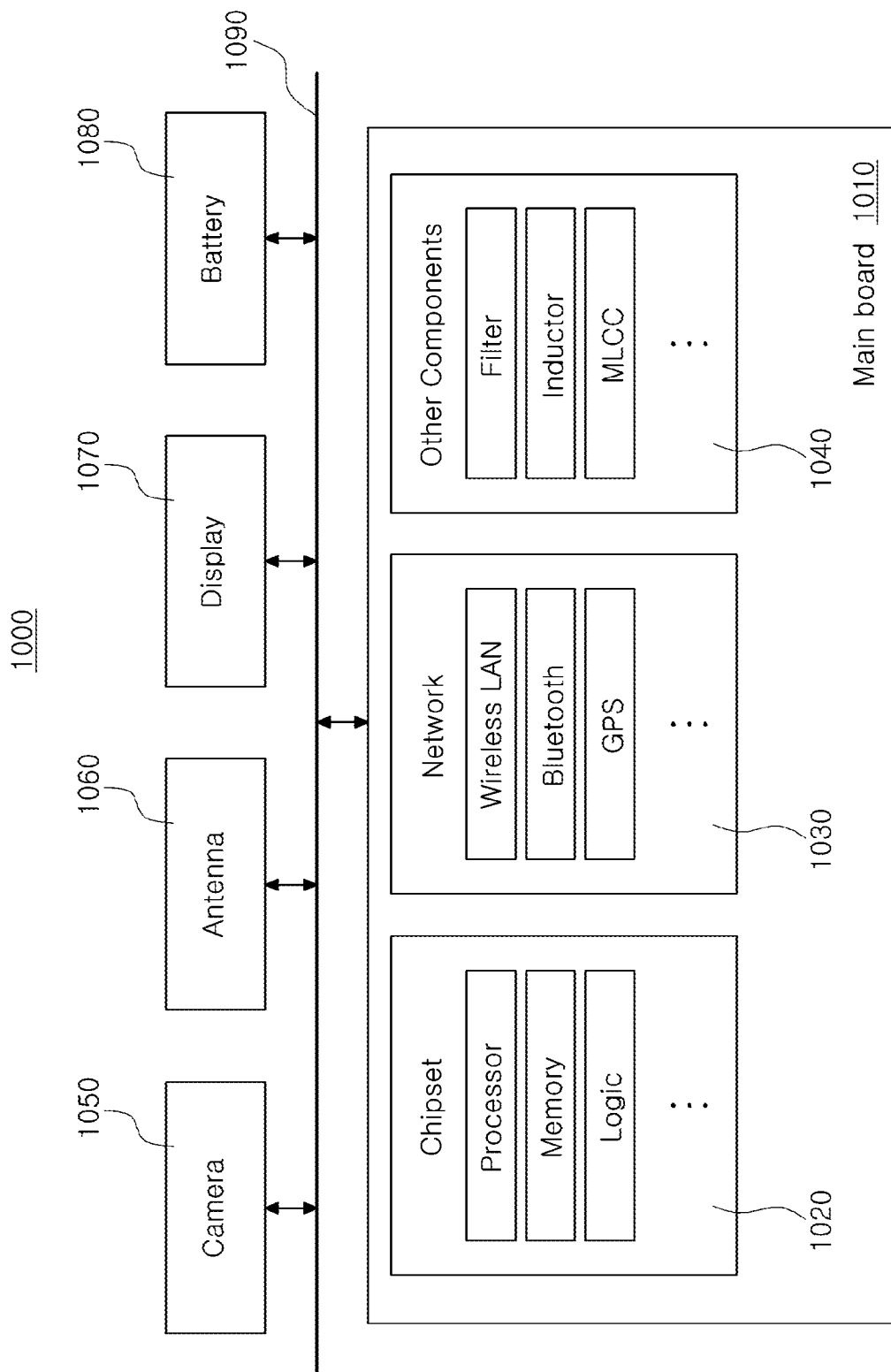
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010. The mainboard 1010 may be physically and/or electrically connected to chip-related components 1020, network-related components 1030, other components 1040, and the like. These components may be combined with other components to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip-related components 1020 are not limited thereto, but may also include other types of chip-related components. In addition, the chip-related components 1020 may be combined with each other.

The network-related components 1030 may include wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the above-mentioned protocols. However, the network-related components 1030 are not limited thereto, and may also include a variety of other wireless or wired standards or protocols. Further, the network-related components 1030 may be combined with each other, together with the chip-related components 1020 described above.

Other components 1040 may include a high frequency inductor, a ferrite inductor, a power inductor, ferrite beads, low temperature co-firing ceramics (LTCC), an electromagnetic interference (EMI) filter, a multilayer ceramic capacitor condenser (MLCC), and the like. However, other components 1040 are not limited thereto, and may also include passive components used for various other purposes, and the like. In addition, other components 1040 may be combined with each other, together with the chip-related components 1020 and/or the network-related components 1030.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), and the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component, or the like. However, the electronic device 1000 is not limited thereto, and may be any other electronic device processing data.

Figure 2:
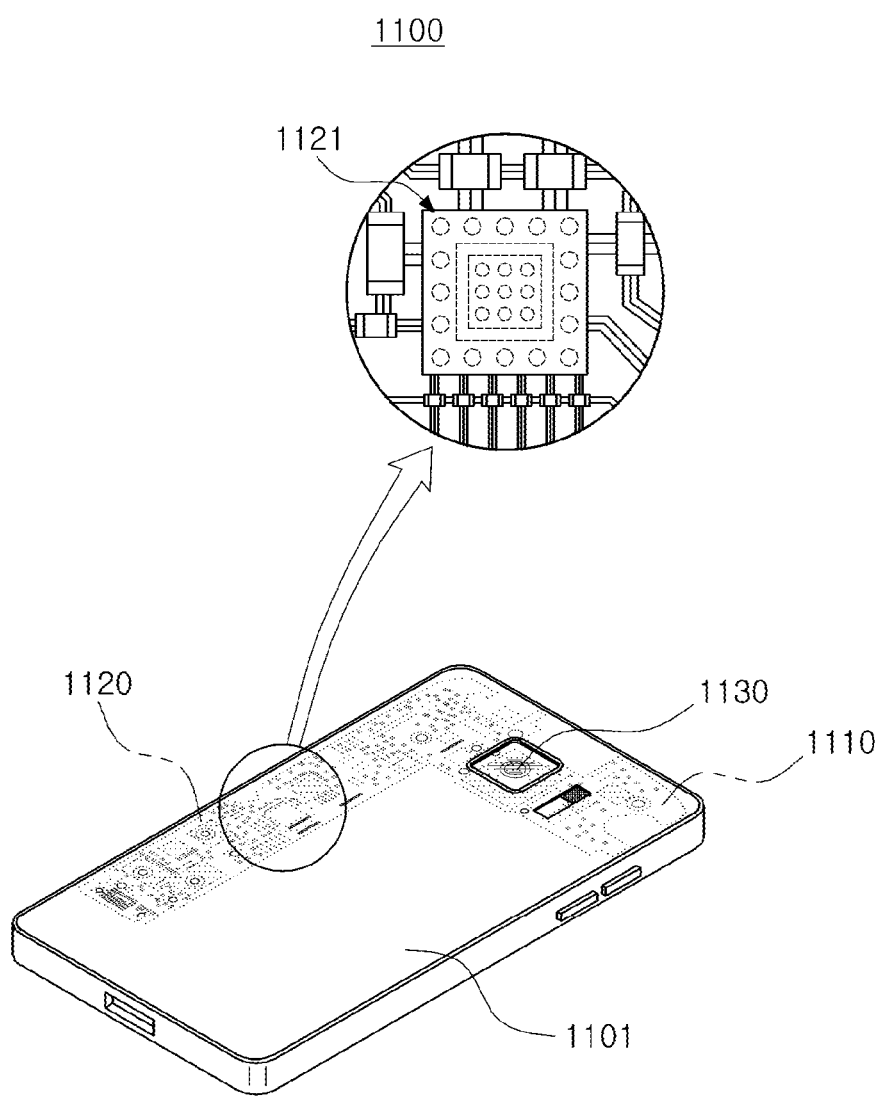
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices as described above. For example, a mainboard 1110 may be accommodated in a body 1101 of a smartphone 1100, and various components 1120 may be physically or electrically connected to the mainboard 1110. In addition, other components that may or may not be physically or electrically connected to the mainboard 1110, such as a camera 1130, may be accommodated in the body 1101. Some of the electronic components 1120 may be the chip-related components, and the semiconductor package 1121 may be, for example, an application processor among the chip-related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, and may be packaged and used in an electronic device, or the like, in a packaged state.

Here, a semiconductor packaging may be required because there may be a difference between a width of a circuit of a semiconductor chip a width of a circuit of a mainboard of an electronic device in terms of electrical connection. Specifically, in the case of a semiconductor chip, a size of connection pads of a semiconductor chip and an interval between the connection pads may be very fine, but in the case of a mainboard used in electronic devices, a size of component mounting pads of a mainboard and an interval between the component mounting pads are significantly larger than those of a semiconductor chip. Therefore, it may be difficult to directly mount the semiconductor chip on the mainboard, and packaging technology for buffering a difference in circuit width between the semiconductor chip and the mainboard may be necessary.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
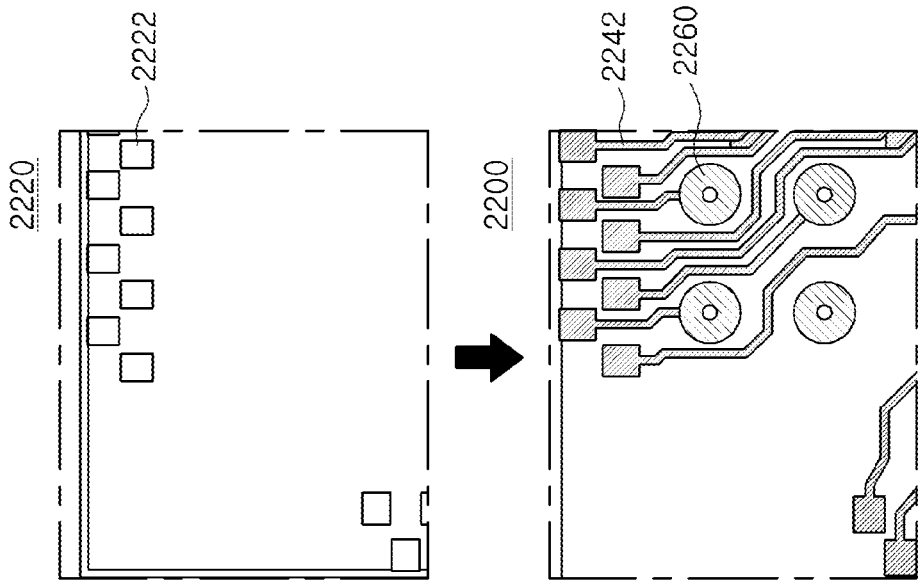
FIGS. 3A and 3B are schematic cross-sectional views illustrating a state of a fan-in semiconductor package before and after being packaged.
Figure 3A:
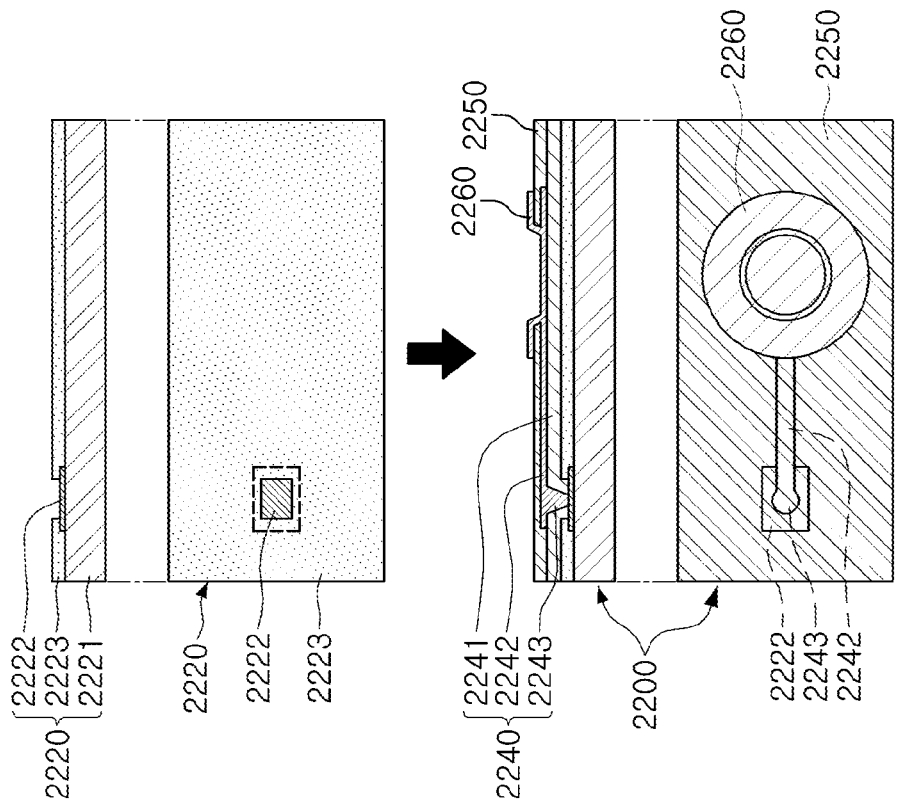

FIGS. 3A and 3B are schematic cross-sectional views illustrating a state of a fan-in semiconductor package before and after being packaged.

Figure 4:
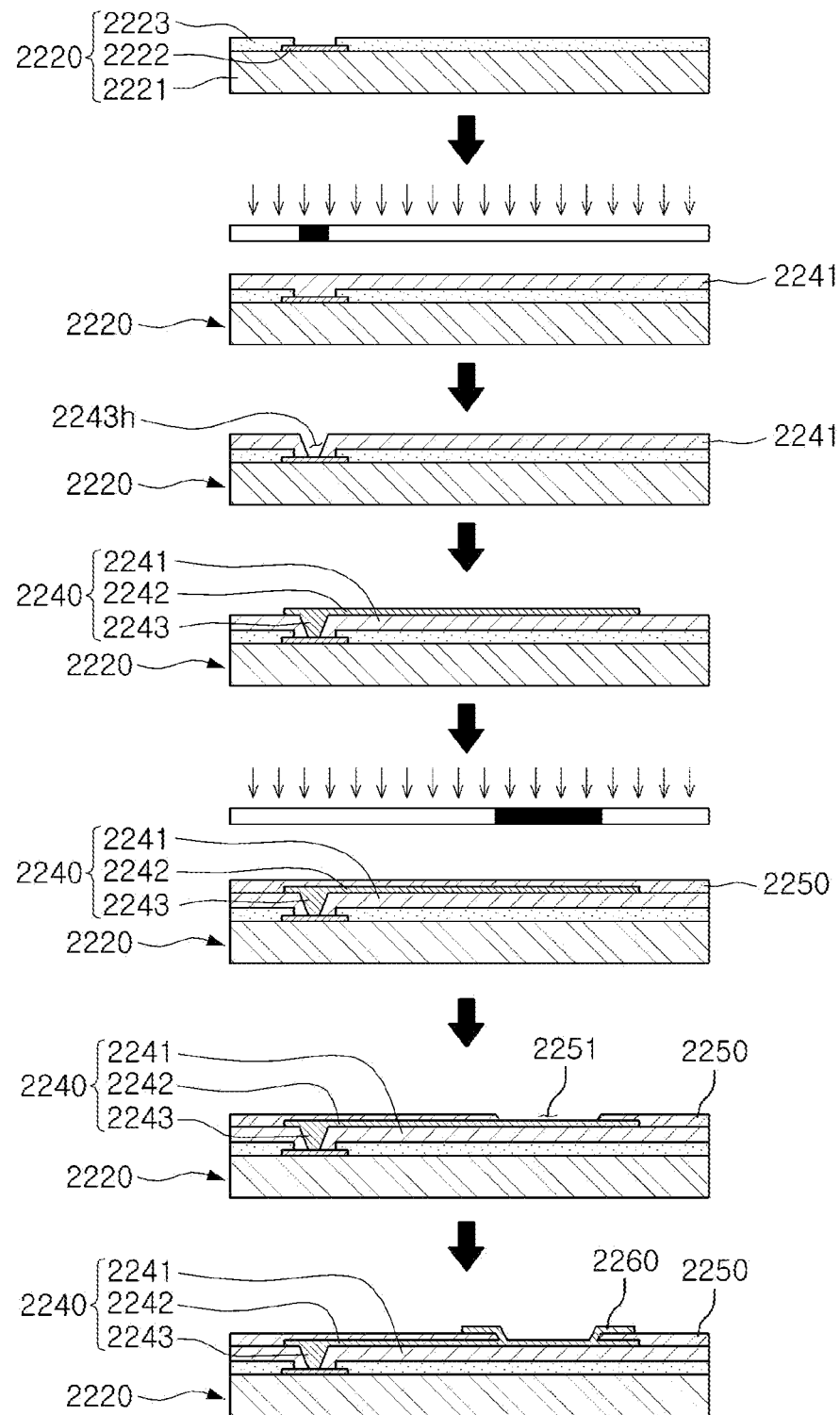
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the FIGS. 3A through 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Accordingly, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device.

The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
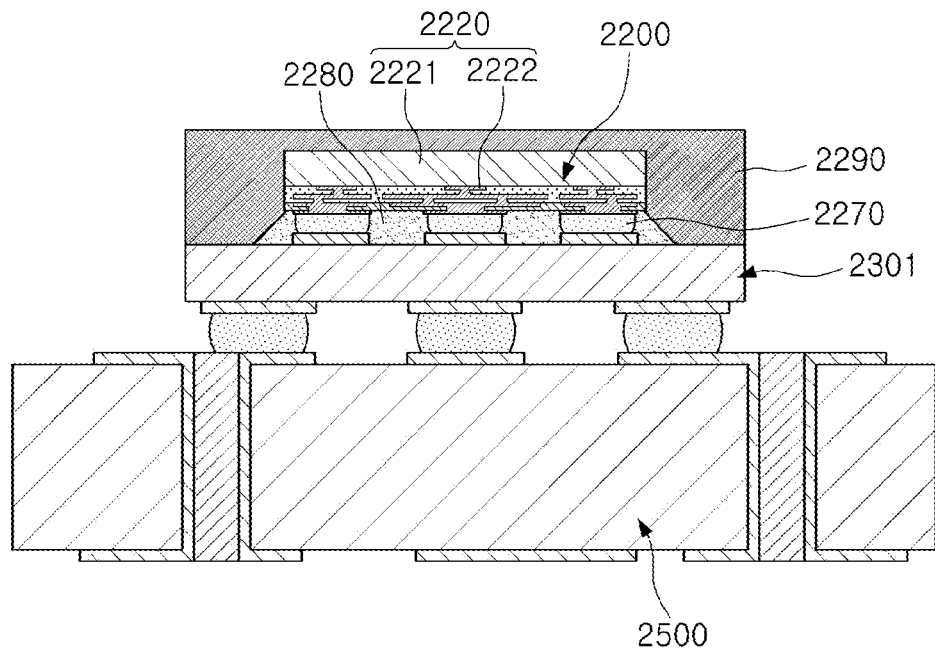
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
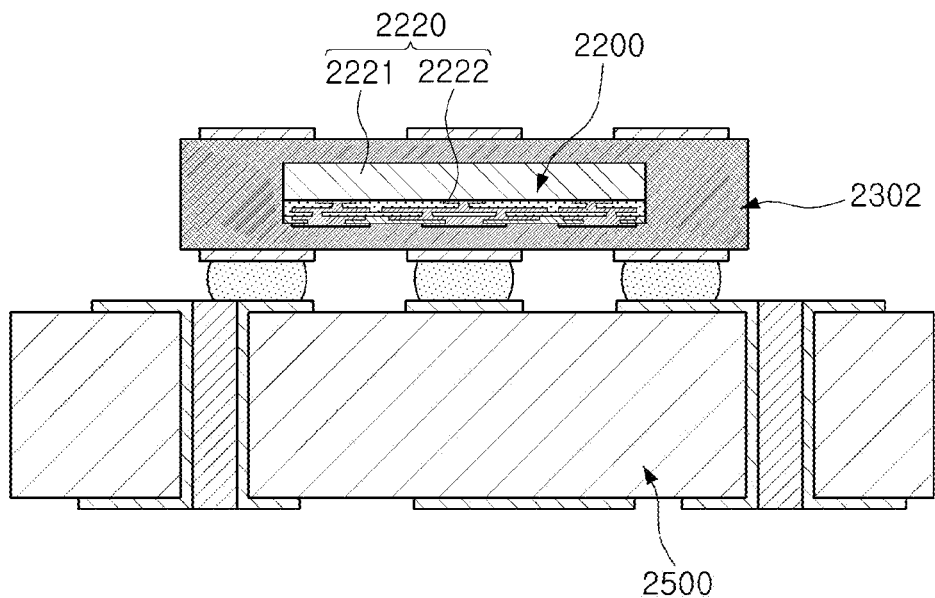
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an external side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process again, or may be mounted and used on the mainboard of the electronic device in a state in which it is embedded in the interposer substrate.

Fan-Out Semiconductor Package

Figure 7:
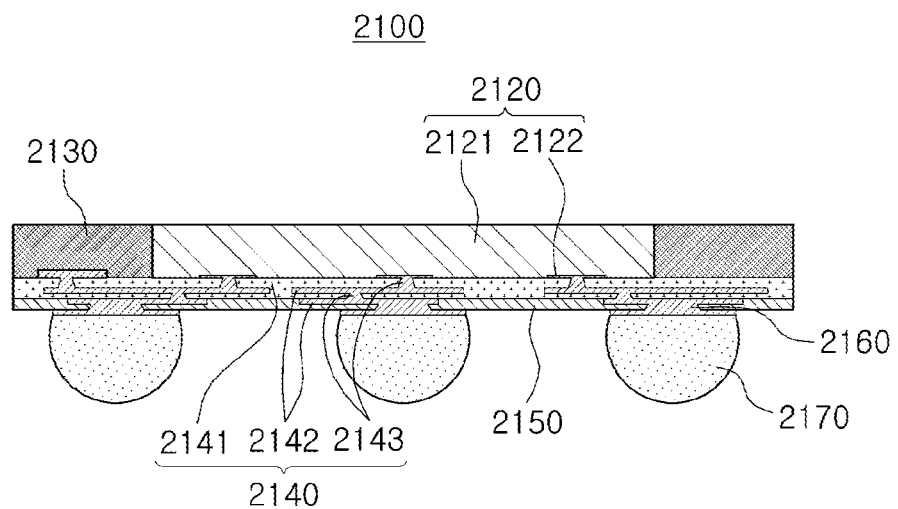
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in an opening of the passivation layer 2150. Solder balls 2170 may further be formed on the underbump metal layer 2160. The semiconductor chip 2120 may be an integrated circuit (IC) including a body 2121, the connection pads 2122, a passivation film (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As such, the fan-out semiconductor package may have a form in which I/O terminals are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
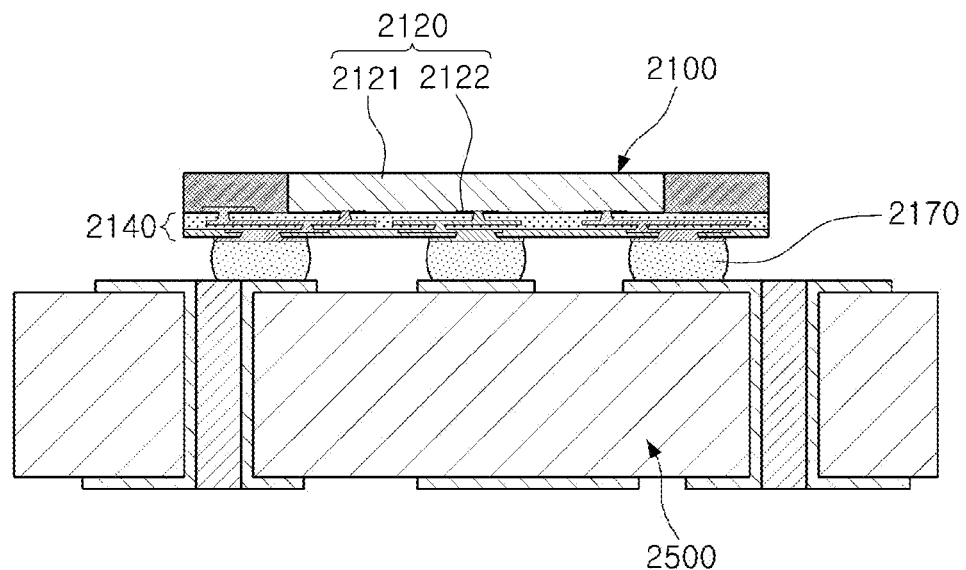
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 may include the connection member 2140 capable of redistributing the connection pads 2122 up to a fan-out area that is beyond a size of the semiconductor chip 2120 on the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. In addition, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Antenna Module

Figure 9:
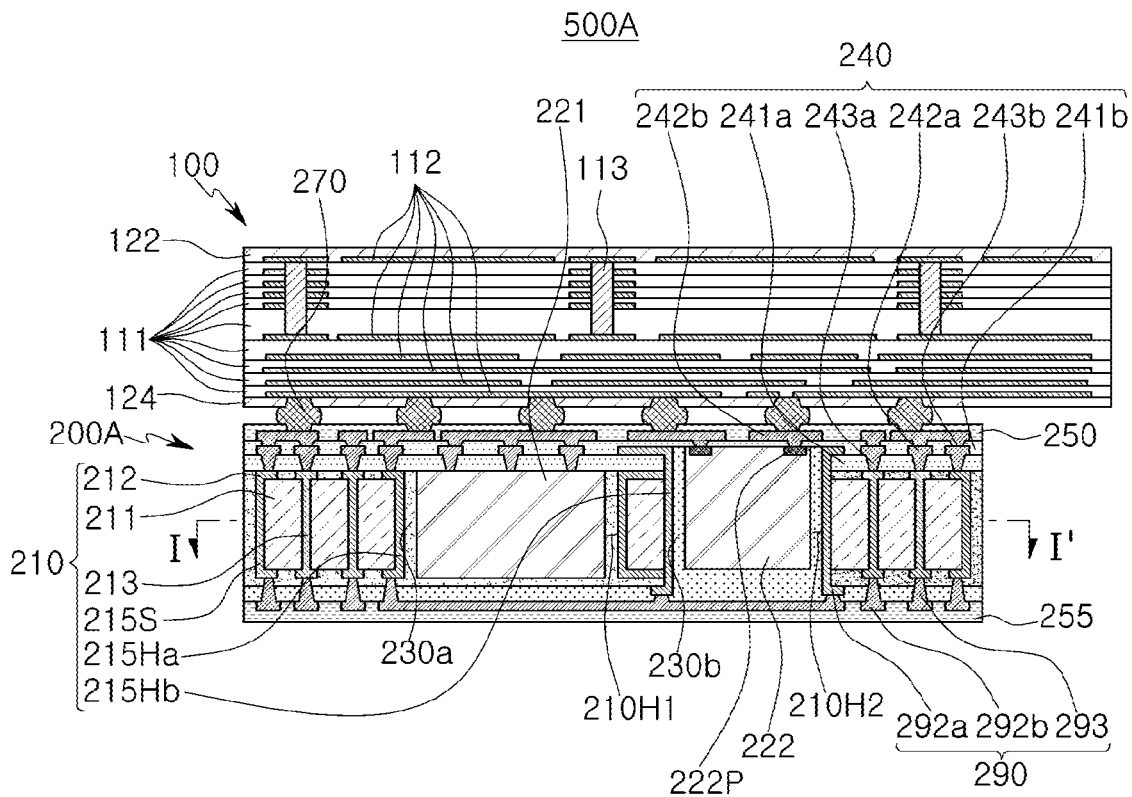
FIG. 9 is a schematic cross-sectional view illustrating an example of an antenna module.

FIG. 9 is a schematic cross-sectional view illustrating an example of an antenna module.

Figure 10:
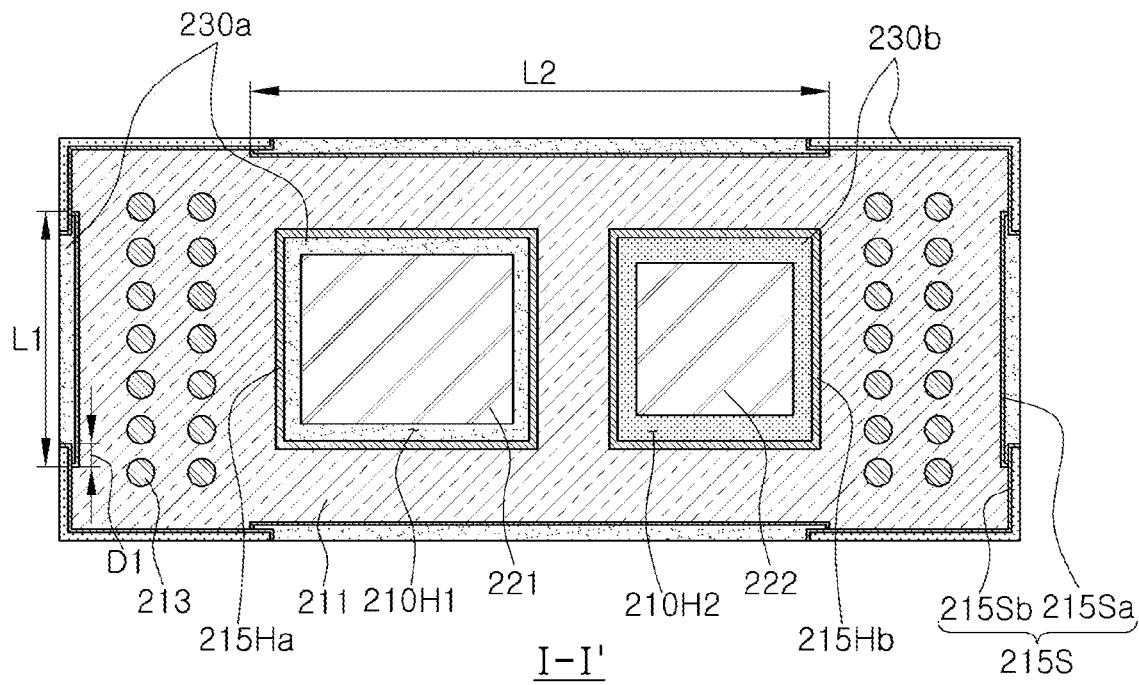
FIG. 10 is a schematic cut-away plan view taken along line I-I' of the antenna module of FIG. 9.

FIG. 10 is a schematic cut-away plan view taken along line I-I' of the antenna module of FIG. 9;

Referring to FIGS. 9 and 10, an antenna module 500A according to an exemplary embodiment in the present disclosure may include an antenna substrate 100 and a semiconductor package 200A disposed on one side of a lower surface of the antenna substrate 100 to be electrically connected to the antenna substrate 100. The antenna substrate 100 may be an area capable of implementing millimeter (mm) wave/5G antenna, and include a substrate wiring layer 112 including an antenna pattern and a ground pattern. Specifically, the antenna substrate 100 may include a substrate insulating layer 111, a substrate wiring layer 112, a connection via layer 113, and substrate passivation layers 122 and 124. The semiconductor package 200A may include a frame 210 having first and second through-holes 210H1 and 210H2, an electronic component 221 disposed in the first through-hole 210H1 of the frame 210 and including at least one of a semiconductor chip and a passive component; at least one semiconductor chip 222 disposed in the second through-hole 210H2 of the frame 210 and having an active surface on which a connection pad 222P is disposed and an inactive surface disposed on an opposite side of the active surface; a first encapsulant 230a encapsulating at least portions of the frame 210 and the electronic component 221; a second encapsulant 230b encapsulating at least portions of the frame 210 and the semiconductor chip 222; a connection member 240 disposed on the frame 210, the electronic component 221, and the active surface of the semiconductor chip 222; a passivation layer 250 disposed on the connection member 240, an electrical connection structure 270 disposed on an opening of the passivation layer 250, and a backside wiring structure 290 disposed on a lower portion of the frame 210. In particular, the frame 210 may include an insulating layer 211, a wiring layer 212 disposed on upper and lower surfaces of the insulating layer 211, and a via 213 penetrating the upper and lower surfaces of the insulating layer 211, and the frame 210 may further include a first metal layer 215S on an external side wall of the insulating layer 211 and second metal layers 215Ha and 215Hb disposed respectively on internal side walls of the through-holes 210H1 and 210H2.

Recently, in accordance with the trend for high performance of electronic devices, various components mounted on mobile devices such as smartphones have been used at higher frequencies and bandwidths thereof are increasing. Particularly, in the case of a millimeter (mm) wave/5G antenna module, an electromagnetic interference (EMI) structure between mounting components such as a semiconductor chip using a high frequency may be required.

Meanwhile, when an antenna module is implemented in a general system-in-package (SIP) type module manner, various semiconductor chips and passive components may be mounted on a bottom surface of an antenna substrate by surface mount technology (SMT), and in order to prevent electromagnetic interference (EMI), a shield covering the semiconductor chips and the passive components is attached to the semiconductor chips and the passive components, or the semiconductor chips and the passive components are covered with an epoxy molding compound (EMC), and a metal layer is then formed on an outer surface of the EMC.

On the other hand, in an antenna module 500A according to the exemplary embodiment, a semiconductor package 200A in which various electronic components 221 and a semiconductor chip 222 are packaged in one package may be mounted on an antenna substrate 100, and the frame 210 of the semiconductor package 200A may include a first metal layer 215S covering an external side thereof and second metal layers 215Ha and 215Hb covering internal side surfaces exposed through the through-holes 210H1 and 210H2. The via 213 in the frame 210 may be disposed between the first metal layer 215S and the second metal layers 215Ha and 215Hb, such that it may be electrically shielded by the first metal layer 215S and the second metal layers 215Ha and 215Hb. In particular, the via 213 in the frame 210 may be electrically connected to an upper antenna substrate 100 to provide a path for high-speed data or RF frequency signals. Therefore, the via 213 may be located between the first metal layer 215S and the second metal layers 215Ha and 215Hb such that the electrical shielding between the via 213 and the surrounding environment may be enhanced and at the same time, shielding between the electronic component 221 and the semiconductor chip 222 and the via 213 may be enhanced. In addition, the electronic component 221 and the semiconductor chip 222 may be disposed to be surrounded by the second metal layers 215Ha and 215Hb, respectively and they may be surrounded once more by the first metal layer 215S from the outside, such that the electrical shielding both internally and externally may be enhanced, and the heat dissipation characteristics may be also improved.

In addition, a backside wiring layer 292b, a portion of a backside wiring structure 290 may be disposed on the inactive surface of the semiconductor ship 222, and the semiconductor chip 222 may be mounted such that a shielding structure is disposed on five surfaces including side surfaces and lower surfaces. In this case, the backside via 293 connecting the backside wiring layer 292b may be a line via having a linear shape. The electromagnetic wave shielding for the semiconductor chip 222 may further be enhanced by the backside wiring layer 292b and the backside via 293 having a linear shape.

Hereinafter, each configuration included in the antenna module 500A according to an exemplary embodiment will described in more detail.

As a material of the substrate insulating layer 111, an insulating material may be used, and as the insulating material, a thermosetting resin such as an epoxy resin, a thermoplastic resin such as polymide, a material including a reinforcing material such as an inorganic filler together with the above resin materials, for example, an Ajinomoto Build-up Film (ABF) may be used. However, the present disclosure is not limited thereto, and a Photo Image-able Dielectric (PID), or the like may be used. Even when the materials of the respective layers 111 are the same, boundaries therebetween may be clear.

The substrate wiring layer 112 may include an antenna pattern realizing an mm Wave/5G antenna, and may further include a ground pattern, a feed pattern, and the like. The antenna pattern may be a dipole antenna, a patch antenna, or the like, depending on the disposition and the shape of the antenna pattern. The ground pattern may be in a form of a ground plane. A periphery of the antenna pattern may be surrounded by a ground pattern disposed at the same level, but is not limited thereto. The substrate wiring layer 112 may include other signal patterns or power patterns, resistance patterns, or the like. The substrate wiring layer 112 may be formed of a conductive material such as copper (Cu), aluminum (Al), silver (Ag), tin (Sn), gold (Au), nickel (Ni), lead (Pb), titanium (Ti), or an alloy thereof, but is not limited thereto.

A connection via layer 113 may electrically connect the substrate wiring layer 112 formed on the different layers, thereby providing an electrical path in the antenna substrate 100. The connection via layer 113 may include a feeding via electrically and/or signally-connected to the antenna pattern, and may further include a ground connection via, or the like. The connection via layer 113 may include other signal connection vias, power connection vias, or the like. A portion of the ground connection vias may surround the periphery of the feeding vias. The connection via layer 113 may be formed of a conductive material such as copper (Cu), aluminum (Al), silver (Ag), tin (Sn), gold (Au), nickel (Ni), lead (Pb), titanium (Ti), or alloys thereof. A connection via of each of the connection via layer 113 may be entirely filled with the conductive material, or the conductive material may be formed along a wall of each of via holes unlike illustrated in the drawing. In addition, each of the connection via layers 113 may have all of any known vertical cross-sectional shapes such as a cylindrical shape, a hourglass shape, a tapered shape, or the like.

According exemplary embodiments, the antenna substrate 100 may include a core layer, and it may have a form in which the substrate insulating layer 111 is built-up on both sides based on the core layer. An insulating material may be used as a material of the core layer. In this case, the insulating material may be a thermosetting resin such as an epoxy resin, a thermoplastic resin such as a polyimide resin, a material including a reinforcing material such as a glass fiber (or a glass cloth or a glass fabric) and/or an inorganic filler together with the thermosetting resin and the thermoplastic resin, for example, prepreg. However, the material of the core layer is not limited to the resin, and may be, for example, a glass plate or a ceramic plate.

The substrate passivation layers 122 and 124 may be disposed on upper and lower surfaces of the antenna substrate 100 to protect internal components of the antenna substrate. The substrate passivation layers 122 and 124 may also an insulating layer, respectively, for example, an ABF, or the like, but are not limited thereto.

Since the frame 210 includes the wiring layer 212, the number of layers of the connection member 240 may be reduced. In addition, the frame 210 may further improve rigidity of the semiconductor package 200A according to specific materials, and may perform securing uniformity of the thickness of the encapsulants 230a and 230b, or the like. The frame 210 may have first and second through-holes 210H1 and 210H2. The first and second through-holes 210H1 and 210H2 may be disposed to be physically spaced apart. The electronic component 221 and the semiconductor chip 222 may be disposed in the first and second through-holes 210H1 and 210H2, respectively. As illustrated in FIG. 10, the electronic component 221 and the semiconductor chip 222 may be disposed to be spaced apart from wall surfaces of the through-holes 210H1 and 210H2 by a predetermined distance, and may be surrounded by wall surfaces of the through-holes 210H1 and 210H2, but is not limited thereto. In addition, in the exemplary embodiments, the frame 210 may have three or more through-holes, and the number of through-holes and the kinds of electronic components disposed in the through-holes may be variously changed.

An insulating material may be used as the material of the insulating layer 211. In this case, the insulating material may be a thermosetting resin such as an epoxy resin, a thermoplastic resin such as polyimide, or an insulating material impregnated with a core material such as an inorganic filler and/or a glass fiber (or a glass cloth or a glass fabric), for example, a prepreg, an Ajinomoto Build-up Film (ABF), FR-4, Bismaleimide Triazine (BT), or the like, but is not limited thereto. For example, as the material of the insulating layer 211, a glass or ceramic-based insulating material may be applied to the required material properties.

The wiring layer 212 may perform the function of redistributing the connection pad 222P of the semiconductor chip 222. In addition, the wiring layer may be used as a connection pattern when electrically connecting the semiconductor package 200A to the upper and lower other components. A material of the wiring layer 212 may be a conductive material such as copper (Cu), aluminum (Al), silver (Ag), tin (Sn), gold (Au), nickel (Ni), lead (Pb), titanium (Ti), or alloys thereof.

The via 213 may penetrate the upper and lower surfaces of the insulating layer 211 and form an electrical path between the antenna substrate 100 and the electronic component 221 and the semiconductor chip 222. In particular, a high frequency signal may be transmitted through the via 213. A material of the via 213 may be a conductive material such as copper (Cu), aluminum (Al), silver (Ag), tin (Sn), gold (Au), nickel (Ni), lead (Pb), titanium (Ti), or alloys thereof. The via 213 may be entirely filled with the conductive material, or the conductive material may be formed along a wall of each of via holes. In addition, the via may have all of any shapes such as a cylindrical shape, or the like.

The metal layers 215S, 215Ha, and 215Hb may include a first metal layer 215S disposed on an external side surface or an external side wall of the frame 210 and second metal layers 215Ha and 215Hb disposed on internal side walls of the through-holes 210H1 and 210H2, respectively. An entire surface of the frame 210 or the insulating layer 211 may be covered by the metal layers 215S, 215Ha, and 215Hb.

The first metal layer 215S, as illustrated in FIG. 10, may be disposed to surround the entire external side surface of the insulating layer 211 forming the frame 210, and may include first and second side surface layers 215Sa and 215Sb forming at least one step or a bent portion and contacting in some portions. The first and second side surface layers 215Sa and 215Sb of the first metal layer 215S may be disposed between the first and second encapsulants 230a and 230b and the insulating layer 211, respectively, on the external side surface of the frame 210. A portion of the first metal layer 215S may be exposed through the external side surface of the semiconductor package 200A. For example, the second side surface layer 215Sb may be exposed between the first and second encapsulants 230a and 230b at a periphery of the frame 210. The first and second side surface layers 215Sa and 215Sb may be formed in different process steps and may be disposed on a plane while being overlapped by a first distance D1 on a plane to form a step shape, as illustrated in FIG. 10. However, according to exemplary embodiments, the first distance D1 may be zero, and in this case, end portions of the first and second encapsulants 230a and 230b may not be overlapped with each other, and the end portions of the first and second side surface layers 215Sa and 215Sb may be in contact with each other.

The second metal layers 215Ha and 215Hb may include the first and second through-hole metal layers 215Ha and 215Hb disposed between the first and second encapsulants 230a and 230b and the insulating layer 211 on the internal side walls of the first and second through-holes 210H1 and 210H2, respectively. The first through-hole metal layer 215Ha may be disposed on the internal side wall of the insulating layer 211 of the frame 210 and may have a shape in which the end portion thereof is connected to the wiring layer 212. The second through-hole metal layer 215Hb may extend upwardly and downwardly from the internal side wall of the insulating layer 211 of the frame 210, cover a side surface of the first encapsulant 230a on a lower portion, and be connected to a first backside wiring layer 292a. In addition, it may extend to a side surface of a first redistribution insulating layer 241a at an upper portion to be connected to a first redistribution layer 242a.

The metal layers 215S, 215Ha, and 215Hb may be connected to at least a portion of the wiring layers 212 of the frame 210 in at least one area. The metal layers 215S, 215Ha, and 215Hb may include a conductive material such as copper (Cu), aluminum (Al), silver (Ag), tin (Sn), gold (Au), nickel (Ni), lead (Pb), titanium (Ti), or alloys thereof. The metal layers 215S, 215Ha, and 215Hb may be used as a ground, and in this case, may be electrically connected to a ground of the redistribution layers 242a and 242b of the connection member 240.

The electronic component 221 may be disposed in the first through-hole 210H1. The electronic component 221 may include at least one of a semiconductor chip and a passive component. In exemplary embodiments, the electronic component 221 may correspond to a semiconductor chip, or a passive component, and may include both a semiconductor and a passive component. The passive component may be a capacitor, an inductor, or the like. As an example which is not limited, the passive component may be a capacitor, more specifically, a multilayer ceramic capacitor (MLCC). The semiconductor chip may be a power management integrated circuit (PMIC) and/or a radio frequency integrated circuit (RFIC). The electronic component 221 may be electrically connected to the connection pad 222P of the semiconductor chip 222 through the connection member 240. The numbers, types, and the disposition of the electronic component 221 mounted in the semiconductor package 200A may be variously changed in the exemplary embodiments. However, according to exemplary embodiments, the semiconductor package 200A may not include the electronic component 221. In this case, the frame 210 may not have the first through-hole 210H1, and the first encapsulant 230a may be disposed only on the external side surface of the frame 210.

The semiconductor chip 222 may be disposed in the second through-hole 210H2. The semiconductor chip 222 may be, for example, a power management (PMIC) and/or a radio frequency integrated circuit (RFIC). In the semiconductor chip 222, a surface on which the connection pad 222P is disposed may be an inactive surface, and an opposite surface thereof may be an inactive surface. The semiconductor chip 222 may be formed based on an active wafer, and in this case, silicon (Si), germanium (Ge), gallium arsenide (GaAs), or the like may be used as a base material. The connection pad 222P may be for electrically connecting the semiconductor chip 222 with other components. As a material of the connection pad 222P, a conductive material such as aluminum (Al), or the like may be used with any particular limitations. The semiconductor chip 222 may be electrically connected to the antenna substrate 100 and the electronic component 221 through the connection pad 222P, the connection member 240, and the like. The number and disposition of the semiconductor chip 222 mounted in the semiconductor package 200A may be variously changed in exemplary embodiments.

The first encapsulant 230a may protect the electronic component 221 and provide an insulating area. The first encapsulant 230a may fill at least a portion of the first through-hole 210H1, and encapsulate the electronic component 221. An encapsulation form of the first encapsulant 230a is not particularly limited, and may be a form in which the first encapsulant 230a surrounds at least a portion of the electronic component 221. For example, the first encapsulant 230a may cover a side surface and a lower surface of the electronic component 221. A specific material of the first encapsulant 230a may not be particularly limited, and an insulating material such as ABF may be used. The photo-imagable encapsulant (PIE) may be used, as required. The first encapsulant 230a may extend on the frame 210 to cover the lower surface of the insulating layer 211.

The second encapsulant 230b may fill at least a portion of the second through-hole 210H2, and encapsulate the semiconductor chip 222. An encapsulation form of the second encapsulant 230b is not particularly limited, and may be a form in which the second encapsulant 230b surrounds at least a portion of the semiconductor chip 222. For example, the second encapsulant 230b may cover at least a portion of the frame and the inactive surface of the frame 210, and may fill at least a portion of a space between a wall surface of the second through-hole 210Hb and a side surface of the semiconductor chip 222. Meanwhile, the second encapsulant 230b may fill the second through-hole 210Hb to thus serve as an adhesive for fixing the semiconductor chip 222 and reduce buckling of the semiconductor chip 222 depending on certain materials. The second encapsulant 230b may be disposed at the lower portion of the semiconductor chip 222, and extend to the lower portion of the first encapsulant 230a, such that the second encapsulant 230b may be disposed on the first encapsulant 230a on the electronic component 221 and the frame 210. Therefore, the first and second encapsulants 230a and 230b may be sequentially laminated and disposed on the electronic component 221 and the frame 210, and only the second encapsulant 230b may be disposed on the semiconductor chip 230b.

The first and second encapsulants 230a and 230b may be alternately disposed along the external side surface or the external side wall of the frame 210, as illustrated in FIG. 10. The first and second encapsulants 230a and 230b may have different widths on the external side surface of the frame 210. For example, as illustrated in FIG. 10, the first encapsulant 230a may be located on the external side surface of the frame 210 having first and second lengths L1 and L2 in a center of each side, and the second encapsulant 230b may be located in an area including an edge. The first and second lengths L1 and L2 may be variously changed in the exemplary embodiments, and the dispositional form of the first and second encapsulants 230a and 230b may be changed, accordingly.

The connection member 240 may redistribute the connection pad 222P of the semiconductor chip 222. The connection pad 222P of several tens to hundreds of semiconductor chips 222 having various functions may be redistributed through the connection member 240, respectively. In addition, the connection member 240 may electrically connect the connection pad 222P of the semiconductor chip 222 to the electronic component 221. In addition, the connection member 240 may provide an electrical connection path with the antenna substrate 100. The connection member 240 may include a first redistribution insulating layer 241a disposed on upper portions of the frame 210 and the electronic component 221, a first redistribution layer 242a disposed on an upper surface of the first redistribution insulating layer 241a, a first redistribution via 243a penetrating the first redistribution insulating layer 241a and electrically connecting the electronic component 221 and the first redistribution layer 242a, a second redistribution insulating layer 241b disposed on the upper surface of the first redistribution insulating layer 241a and the active surface of the semiconductor chip 222 and covering at least a portion of the first redistribution layer 242a, a second redistribution layer 242b disposed on the upper surface of the second redistribution insulating layer 241b, and a second redistribution via 243b penetrating the second redistribution insulating later 241b and electrically connecting the first and second redistribution layers 242a and 242b, and the connection pad 222P of the semiconductor chip 222 and the second redistribution layer 242b. The connection member 240 may be composed of a single layer, or may be designed in a plurality of layers provided in a higher number than is depicted in the drawings appended hereto.

As insulating material may be used as a material of the first redistribution insulating layer 241a. In this case, the insulating material may be a non-photosensitive insulating material including an inorganic filler such as silica or alumina, for example, ABF. In this case, a problem regarding the undulation and the defect caused by the crack may be prevented more effectively. In addition, a problem of an electrode open defect due to bleeding of the material forming the first encapsulant 230a may be effectively solved. That is, when the non-photosensitive insulating material including an inorganic filler is used for the first redistribution insulating layer 241a, the problem simply using the photosensitive insulating material (PID) may be more effectively solved.

As the second redistribution insulating layer 241b, a photosensitive insulating material (PID) may be used. In this case, a fine pitch may be introduced through a photo via, such that tens or millions of connection pads 222P may be redistributed very effectively as in an usual case. The photosensitive insulating material (PID) may or may not contain a small amount of inorganic filler. That is, by selectively controlling materials of the first redistribution insulating layer 241a on which the first redistribution layer 242a and the first redistribution via 243a for redistributing the electronic component 221 are formed, and the second redistribution insulating layer 241b on which the second redistribution layer 242b and the second redistribution via 243b for redistributing the connection pad 222P of the semiconductor chip 222, superior synergy effect may be obtained.

The redistribution layers 242a and 242b may substantially perform redistributing the electronic component 221 and the connection pad 222P of the semiconductor chip 222, and a material of the redistribution layers 242a and 242b may be a conductive material such as copper (Cu), aluminum (Al), silver (Ag), tin (Sn), gold (Au), nickel (Ni), lead (Pb), titanium (Ti), or alloys thereof. The redistribution layers 242a and 242b may perform various functions according to the design of the layer. For example, the redistribution layers 242a and 242b may include for example, a ground (GND) pattern, a power (PWR) pattern, a signal (S) pattern, or the like. Here, the signal (S) pattern may include various signals except for the ground (GND) pattern, the power (PWR) pattern, or the like, for example, a data signal, or the like. A via pattern, or the like may be further included. The redistribution layers 242a and 242b may include a feeding pattern.

The redistribution vias 243a and 243b may electrically connect the redistribution layers 242a and 242b, the connection pad 222P, the electronic component 221, or the like, formed on different layers to each other, resulting in an electrical path between the antenna substrate 100 and other configurations. A material of each of the redistribution vias 243a and 243b may be a conductive material such as copper (Cu), aluminum (Al), silver (Ag), tin (Sn), gold (Au), nickel (Ni), lead (Pb), titanium (Ti), or alloys thereof. The redistribution vias 243a and 243b may be completely filled with the conductive material, respectively, or the conductive material may be formed along a wall of each of the vias. In addition, the shapes thereof may have a tapered shape opposite to the direction of the backside via 293. The redistribution vias 243a and 243b may include feeding vias.

The backside wiring structure 290 may include a first backside wiring layer 292a disposed on the first encapsulant 230a, a backside via 293 penetrating the first and second encapsulants 230a and 230b or the second encapsulant 230b and connected to the wiring layer 212 of the frame 210 or the first backside wiring layer 292a, and a second backside wiring layer 292b disposed on the second encapsulant 230b and connected to the backside via 293. The first backside wiring layer 292a may be connected to the second through-hole metal layer 215Hb on at least one side. The backside via 293 may be formed at different depths when connected to the wiring layer 212 of the frame 210 and when connected to the first backside wiring layer 292a. The second backside wiring layer 292b may be disposed at lower portions of the electronic component 221 and the semiconductor chip 222 to further improve the EMI shielding effect and the heat radiation effect. Materials of the backside wiring layers 292a and 292b and the backside via 293 may be a conductive material such as copper (Cu), aluminum (Al), silver (Ag), tin (Sn), gold (Au), nickel (Ni), lead (Pb), titanium (Ti), or alloys thereof. At least a portion of the backside wiring layers 292a and 292b and the backside via 293 may be sued as a ground, and in this case, may be electrically connected to the ground among the redistribution layers 242a and 242b of the connection member 240. The backside via 293 may have the shape of a trench via or a line via, extending in a direction not illustrated along the electronic component 221 and the semiconductor chip 222. In this case, the backside via 293 may completely shield the lower portion of the electronic component 221 and the semiconductor chip 222, together with the second backside wiring layer 292b, thereby further improving the EMI shielding effect. The backside via 293 may have a tapered shape in the illustrated cross-section and may have a tapered shape in a direction opposite to the redistribution vias 243a and 243b of the connection member 240.

A passivation layer 250 having an opening exposing at least a portion of the redistribution layer 242b may be disposed on the upper surface of the connection member 240. The passivation layer 250 may protect the connection member 240 from external physical and chemical damage, or the like. The passivation layer 250 may include an insulating resin and an inorganic filler, but may not include a glass fiber. For example, the passivation layer 250 may be ABF, but is not limited thereto, and may be a PID, a solder resist, or the like. A backside passivation layer 255 may also be formed on the backside wiring structure 290. The backside passivation layer 255 may protect the backside wiring layers 292a and 292b. The passivation layer 250 and the backside passivation layer 255 may include the same material to each other, thereby controlling a coefficient of thermal expansion (CTE) by an effect of symmetry.

A plurality of electrical connection structures 270 electrically connected to the exposed second redistribution layer 242b may be disposed on the opening of the passivation layer 250. The electrical connection structure 270 may be a structure for physically and/or electrically connecting the semiconductor package 200A to the antenna substrate 100. The electrical connection structure 270 may be formed of a low meting point metal, such as tin (Sn) or an alloy containing tin (Sn), more specifically solder, or the like, but this is merely an example, but the material thereof is not particularly limited thereto. The electrical connection structure 270 may be a land, a ball, a pin, or the like. The electrical connection structure 270 may be formed of multiple layers or a single layer. In the case of a multi-layered structure, it may include a copper pillar and a solder, and in the case of a single layer, it may include tin-silver solder or copper, but this is also merely an example, but is not limited thereto. The number, spacing, a disposition type of the electrical connection structure 270, or the like are not particularly limited, and may be sufficiently modified according to design specifications for a typical engineer.

At least one of the electrical connection structure 270 is disposed in a fan-out area. The fan-out area means an area outside in which the semiconductor chip 222 is disposed. A fan-out package is more reliable than a fan-in package, is capable of implementing multiple I/O terminals, and facilitates 3D interconnection. In addition, the fan-out package may manufacture package thickness thinner than a Ball Grid Array (BGA) package and a Land Grid Array (LGA) package, and is excellent in price competitiveness.

FIGS. 11A to 15B are schematic plan views and cross-sectional views illustrating an example of a process of forming the antenna module of FIG. 9.

Figure 11A:
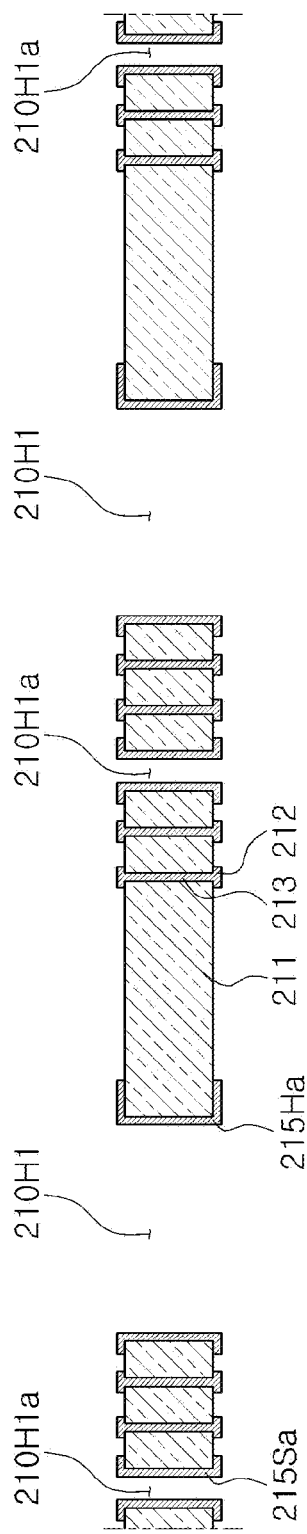
FIGS. 11A to 15B are schematic perspective views and cross-sectional views illustrating an example of a process of forming the antenna module of FIG. 9.
Figure 11B:
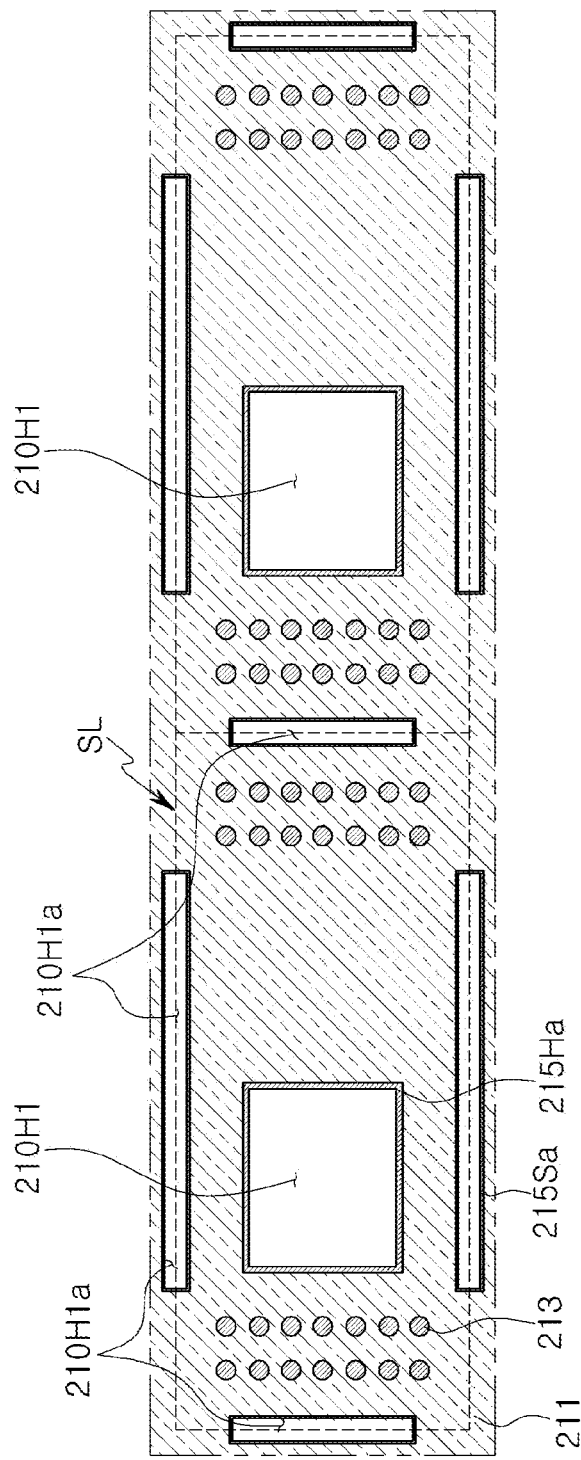

Referring to FIGS. 11A and 11B, an insulating layer 211 constituting a frame 210 may be prepared, a first through-hole 210H1 and a first external through-hole 210H1a penetrating upper and lower surfaces of the frame 210 are formed, a first through-hole metal layer 215Ha and the first side surface layer 215Sa are formed on internal side walls of the first through-hole 210H1 and the first external through-hole 210H1a, respectively, a via 213 penetrating the insulating layer 211, and a wiring layer 212 on the upper and lower surfaces of the insulating layer 211 are formed.

The first through-hole 210H1 and the first external through-hole 210H1a may be formed by a mechanical drill and/or a laser drill. However, it is not limited thereto, and it may be performed by a sandblast method using abrasive particles or a dry etching method using plasma, depending on materials of the insulating layer 211. The size, shape, or the like, of the first through-hole 210H1 may be designed according to the size, shape, and the number, or the like, of the electronic component 221 to be mounted. The first external through-hole 210H1a may be disposed along a package boundary line SL being a cutting line at which a sawing process is performed subsequently. Specifically, the first external through-hole 210H1a may be disposed to be spaced apart from each other along the package boundary line SL. Therefore, the insulating layer 211 may be maintained in a connected state through an area at which the first external through-hole 210H1a is not formed.

The first side surface layer 215Sa and the first through-hole metal layer 215Ha may be formed by a plating process, and may be formed together with the wiring layer 212 of the frame 210. The first side surface layer 215Sa and the first through-hole metal layer 215Ha may be connected to the wiring layer 212 on the upper and lower surfaces of the frame 210. A portion of the wiring layer 212 may be interpreted as constituting the first side surface layer 215Sa and the first through-hole metal layer 215Ha. In this case, the first side surface layer 215Sa may refer to an area particularly disposed on the internal side wall of the first external through-hole 210Ha among the wiring layers 212, and the first through-hole metal layer 215Ha may refer to an area particularly disposed on the internal side wall of the first through-hole 210H1 among the wiring layers 212. The wiring layer 212, the first side surface layer 215Sa, and the first through metal layer 215Ha may have substantially the same thickness. The via 213 may be formed by a method in which a hole is formed by a photolithography method, mechanical drilling, laser drilling, or the like, and then filling a conductive material using plating, or the like.

Figure 12A:
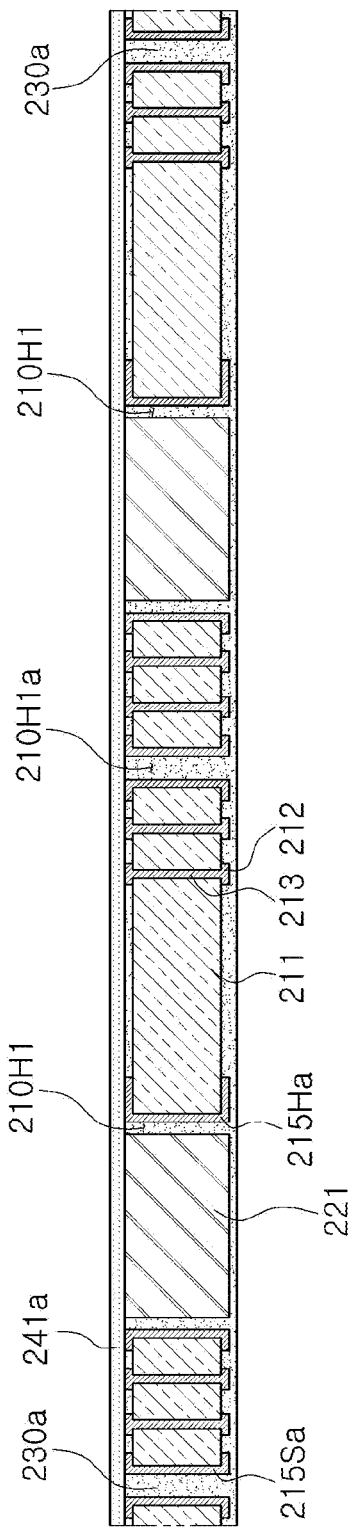
Figure 12B:
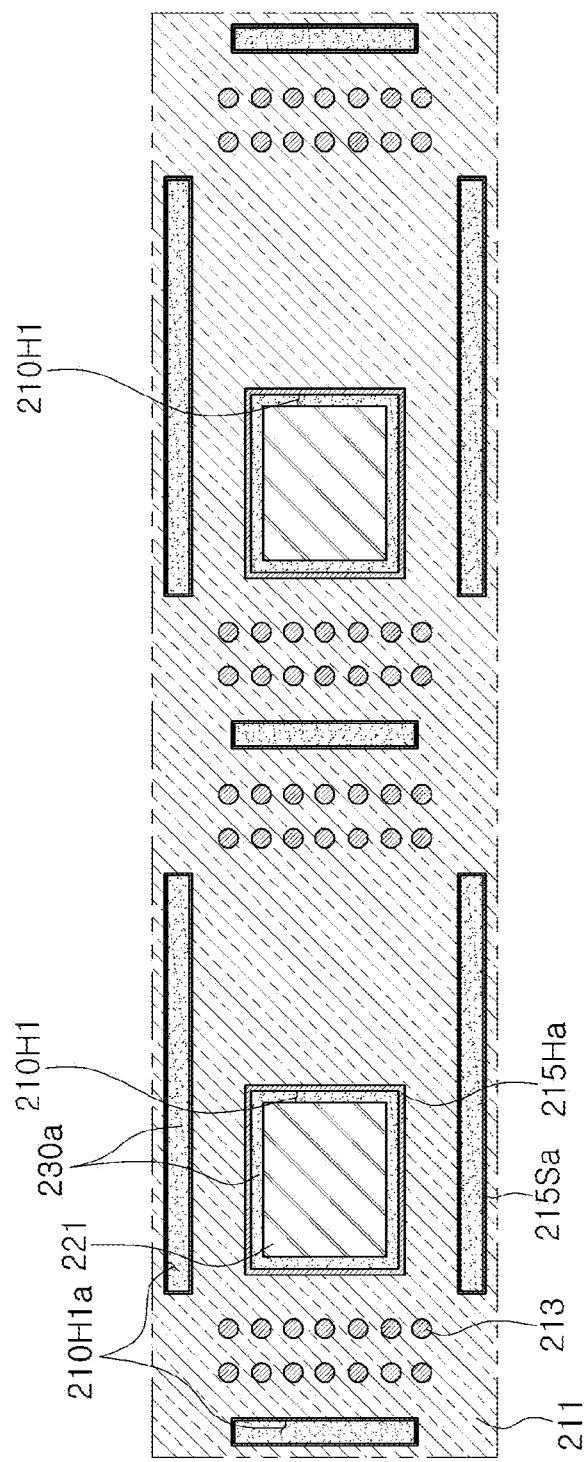

Referring to FIGS. 12A and 12B, an adhesive film may be attached to one side of the insulating layer 211, an electronic component 221 may be disposed in the first through-hole 210H1, and a first encapsulant 230a is formed. Next, the adhesive film may be removed to form the first redistribution insulating layer 241a.

Any adhesive film may be used as long as the adhesive film is able to fix the insulating layer 211, and any known tape, or the like may be used as an example, which is not limited. As examples of the known tape, a thermal treatment curable adhesive tape, adhesive strength of which may be weakened by a thermal treatment, and an ultraviolet curable adhesive tape, adhesive strength of which may be weakened by ultraviolet radiation, and the like. The electronic component 221 may be disposed, for example, by attaching the electronic component 221 to the adhesive film in the first through-hole 210H1. The first encapsulant 230a may encapsulate at least lower surfaces of the insulating layer 211 and the electronic component 221, may fill a space in the first through-hole 210H1 and the first external through-hole 210H1a. The first encapsulant 230a may be formed by a known method. For example, the first encapsulant 230a may be formed by laminating and curing a precursor of the first encapsulant 230a. Alternately, the first encapsulant 230a may be formed by coating the adhesive film with the first encapsulant 230a to encapsulate the electronic component 221 and being cured. By the curing, the electronic component 221 may be fixed. As the laminating method, for example, a method in which a hot press process where a pressure is applied to an object in a high temperature for a certain period of time and is reduced, the object is cooled in a cold press, and a working tool is separated, or the like, may be used. As the coating method, for example, a screen printing method of applying ink using a squeegee, a spray printing method of atomizing ink and spraying the atomized ink, or the like, may be used.

The method of stripping the adhesive film may not be particularly limited, but may be implemented by a known method. For example, in the case in which a thermal treatment curable adhesive tape of which adhesive strength weakens by thermal treatment, an ultraviolet curable adhesive tape of which adhesive strength weakens by ultraviolet radiation, or the like is used, the stripping of the adhesive film may be formed after weakening an adhesive strength thereof by thermal treatment of the adhesive film.

Figure 13A:
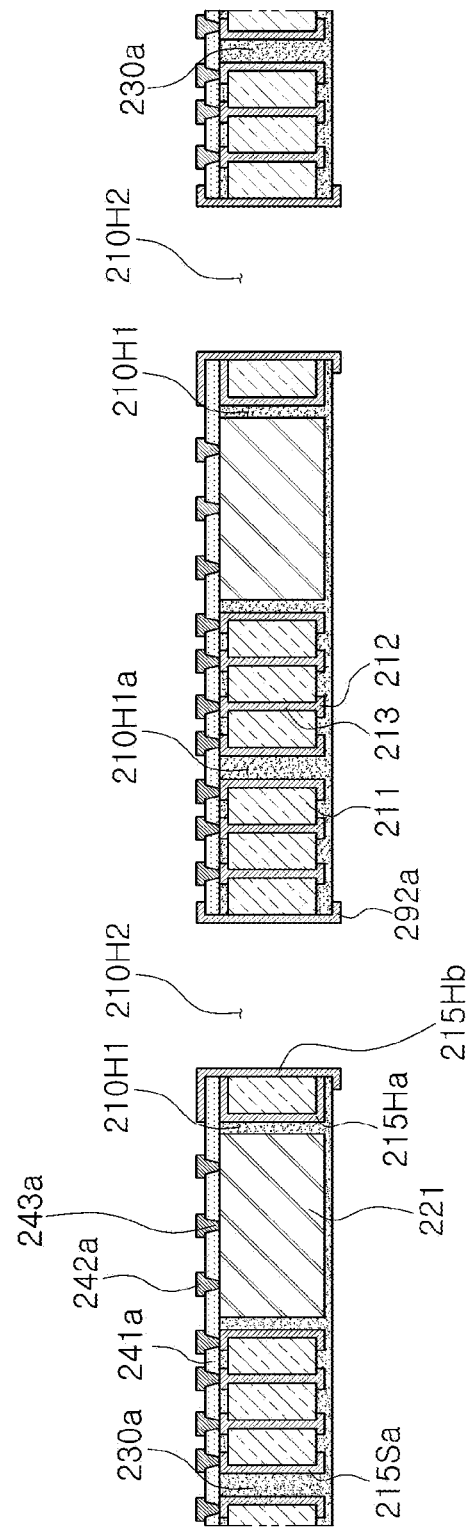
Figure 13B:
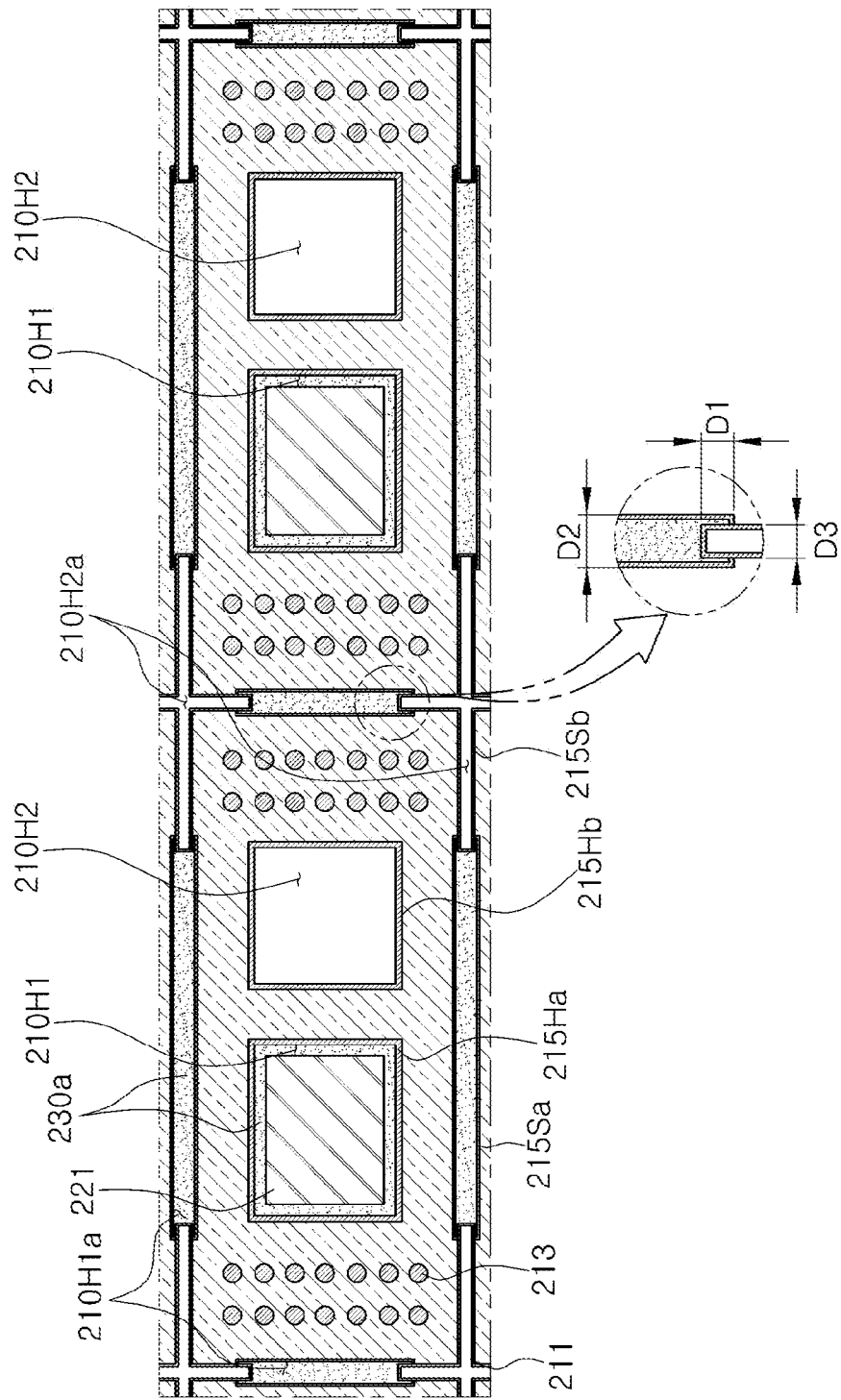

Referring to FIGS. 13A and 13B, a second through-hole 210H2 and a second external through-hole 210H2a penetrating upper and lower surfaces of the frame 210 are formed, a second through-hole metal layer 215Hb and a second side surface layer 215Sb are formed on internal side walls of the second through-hole 210H2 and the second external through-hole 210H2a, respectively, and a first redistribution via 243a penetrating the first redistribution insulating layer 241a, a first redistribution layer 213a on the first redistribution insulating layer 241a, and a first backside wiring layer 292a are formed.

The second through-hole 210H2 and the second external through-hole 210H2a may be formed so as to penetrate through the first encapsulant 230a and the first redistribution layer 241a, in addition to the frame 210. The second through-hole 210H2 and the second external through-hole 210H2a may be formed by the mechanical drilling and/or the laser drilling. The size, shape, and the like, of the second through-hole 210H2 may be designed according to the size, shape, and number of the semiconductor chip 222 to be mounted. The second external through-hole 210H2a may be disposed along a package boundary line SL (referring to FIG. 11B) to serve as a cutting line at which a sawing process is performed subsequently. Particularly, the second external through-hole 210H2a may be disposed along the package boundary line SL to connect between the first external through-hole 210H1a. Accordingly, the insulating layer 211 may be maintained in a connected state in an area in which the second external through-hole 210H2a is not formed, through the first encapsulant 230a filled in the first external through-hole 210H1a. As illustrated in an enlarged view of FIG. 13B, the first and second external through-holes 210H1a and 210H2a may be overlapped with each other in a predetermined distance D1 considering process errors in the connected area. In addition, the first and second external through-holes 210H1a and 210H2a may have different widths D2 and D3, but are not limited thereto, and may have the same width.

The second side surface layer 215Sb and the second through-hole metal layer 215Hb may be formed by a plating process, and may be formed together with the first redistribution layer 241a and the first backside wiring layer 292a. At least portions of the side surface layer 215Sb and the second through-hole metal layer 215Hb may be connected to the first redistribution layer 241a on the upper surface of the frame 210, and may be connected to the first backside wiring layer 292a on the lower surface of the frame 210. The second side surface layer 215Sb, the second through-hole metal layer 215Hb, the first redistribution layer 241a, and the first backside wiring layer 292a may have substantially the same thickness. The first redistribution via 243a may be formed by a method in which a hole is formed by the photolithography method, mechanical drilling and/or laser drilling, or the like, depending on the materials, and filling the conductive material using plating, or the like.

Figure 14A:
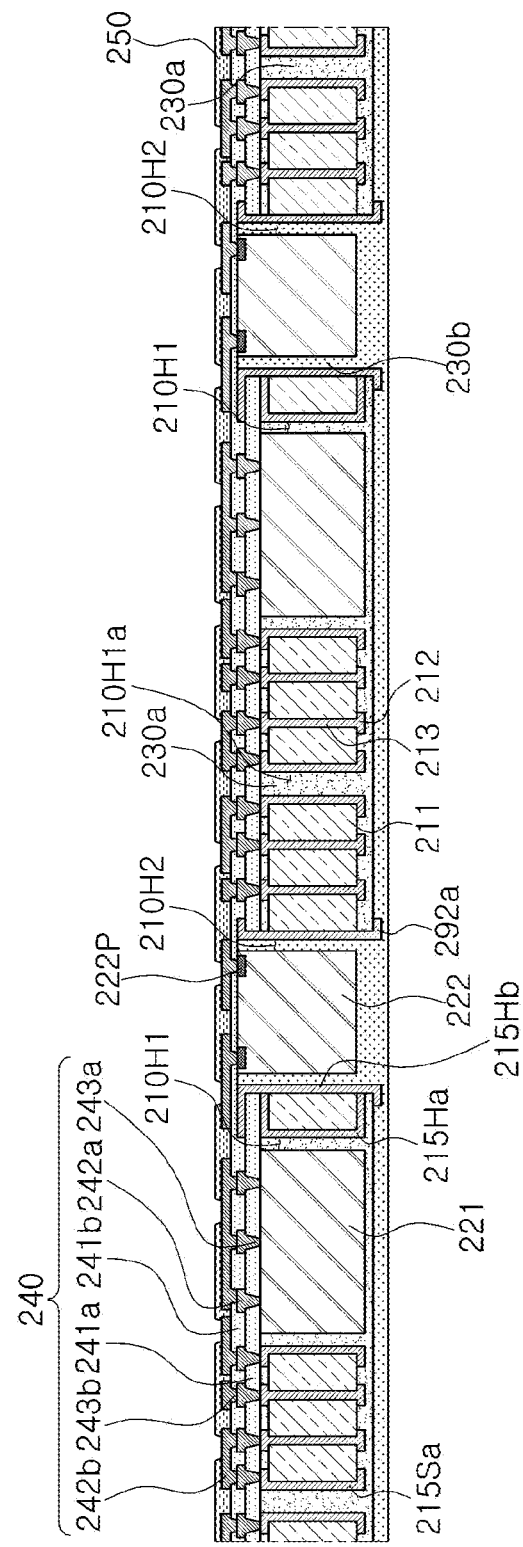
Figure 14B:
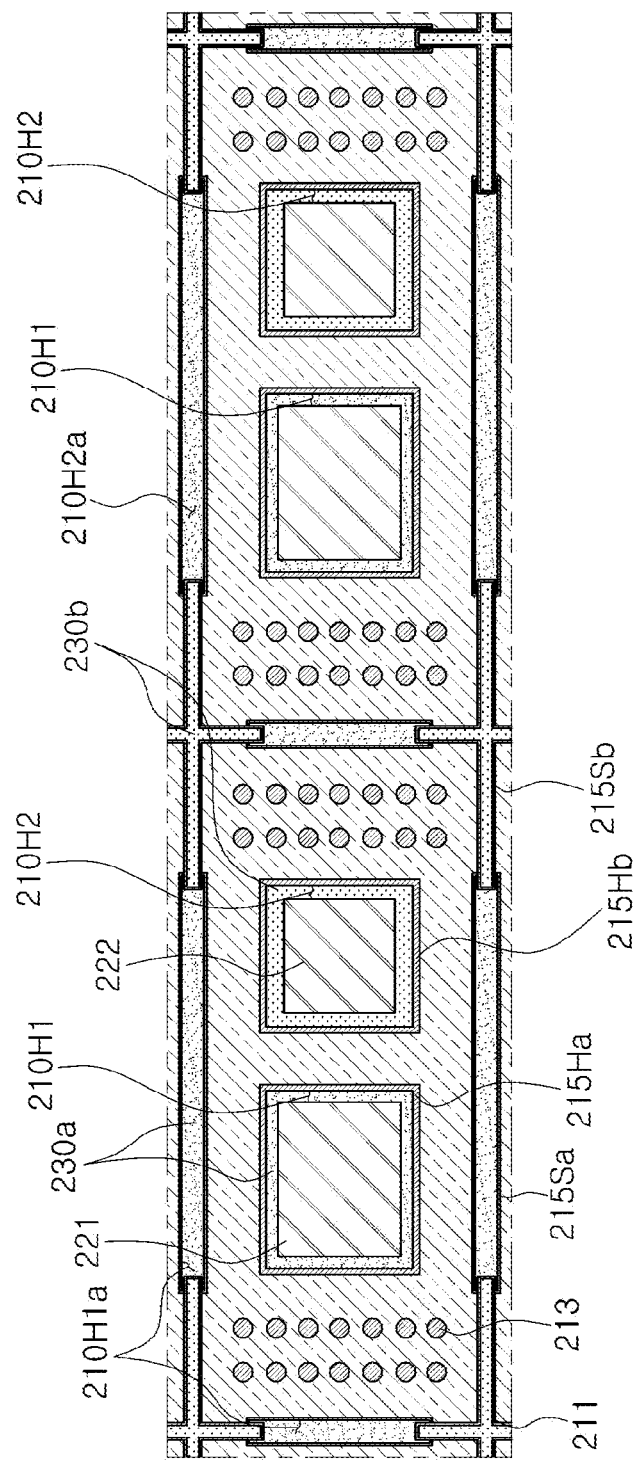

Referring to FIGS. 14A and 14B, an adhesive film may be attached to one side of the insulating layer 211, a semiconductor chip 222 may be disposed in the second through-hole 210H2, and a second encapsulant 230b may be formed. Next, the adhesive film may be removed, a second redistribution insulating layer 241b, a second redistribution via 243b, and a second redistribution layer 242b may be formed, and a passivation layer 250 may be formed.

The adhesive film may be the same as that described above with reference to FIGS. 12A and 12B, and may be removed in the same manner. A semiconductor chip 222 may be disposed, for example, in such a manner it is attached to the adhesive film in the second through-hole 210H2. The second encapsulant 230b may encapsulate at least the lower surface of the semiconductor chip 222 and fill the space in the second through-hole 210H2 and the second external through-hole 210H2a. The second encapsulant 230b may extend to cover the lower surface of the first encapsulant 230a at a lower portion of the electronic component 221. The second encapsulant 230b may be formed in the same manner as the first encapsulant 230a described above. The connection member 240 may be formed by forming the second redistribution insulating layer 241b, the second redistribution via 243b, and the second redistribution layer 242b. A passivation layer 250 may be formed by a method of laminating a precursor of the passivation layer 250 and then curing, by a method of applying a formation material of the passivation layer 250 and then curing.

Figure 15A:
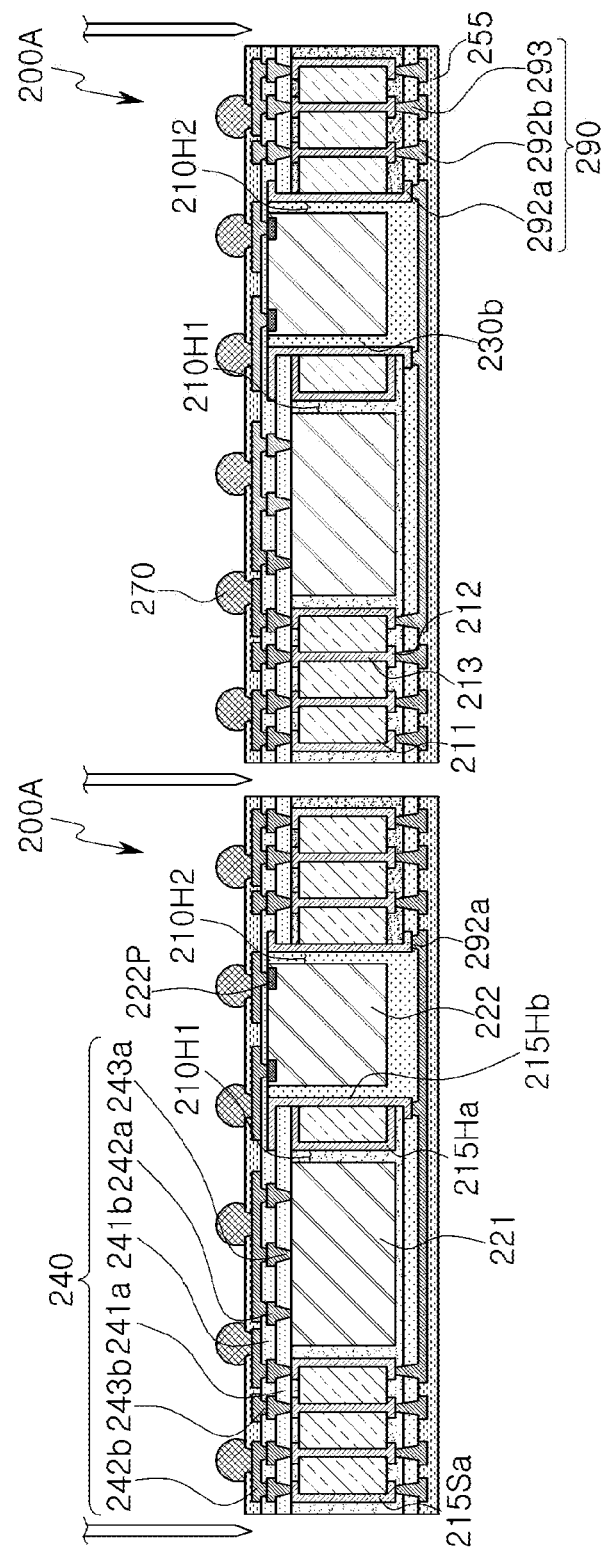
Figure 15B:
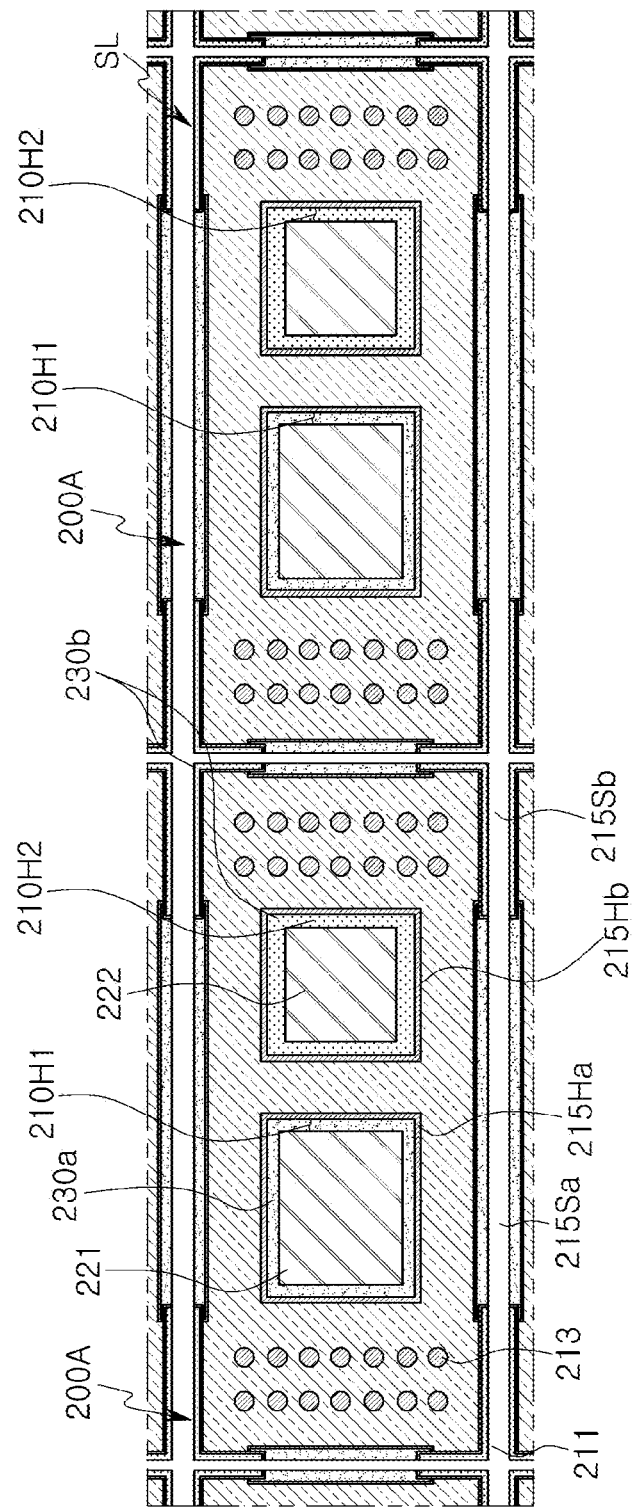

Referring to FIGS. 15A and 15B, a second backside wiring layer 292b and a backside via 293 may be formed on the lower surface of the second encapsulant 230b to form a backside wiring structure 290, and a backside passivation layer 255 covering the backside wiring structure 290 may be formed. Next, an opening exposing at least a portion of the second redistribution layer 242b in the passivation layer 250, and an electrical connection structure 270 may be formed on the opening. Next, a process of singulation may be performed so as to separate into an individual package 200A through a sawing process.

The backside via 293 may penetrate at least one of the first and second encapsulants 230a and 230b to be connected to the first backside wiring layer 292a or the wiring layer 212. The second backside wiring layer 292b and the backside via 293 may be formed by a plating process. The backside passivation layer 255 may be formed in the same manner as the passivation layer 250, and may be simultaneously formed with the passivation layer 250 in this step.

A method of forming the electrical connection structure 270 may not be particularly limited, but may be formed using a method well-known in the art, depending on a structure and a shape. The electrical connection structure 270 may be fixed by reflow, and to enhance fixing strength, a portion of the electrical connection structure 270 may be embedded in the passivation layer 250, and a remaining portion may be exposed externally, thereby improving reliability. A separate underbump metal layer may be further disposed at the lower portion of the electrical connection structure 270.

The sawing process may be performed to cut the first and second encapsulants 230a and 230b along the first and second external through-holes 210H1a and 210H2a. By the sawing process, an individual semiconductor package 200A may be ultimately manufactured. Next, referring to FIG. 9, the semiconductor package 200A and the prepared antenna substrate 100 may be connected to be stacked up and down. The antenna substrate 100 may be connected to the semiconductor package 200A through the electrical connection structure 270. The electrical connection structure 270 may be connected to the substrate wiring layer 112 exposed to the opening of the antenna substrate 100. Thus, ultimately, an antenna module 500A as illustrated in FIG. 9 may be manufactured.

Figure 16:
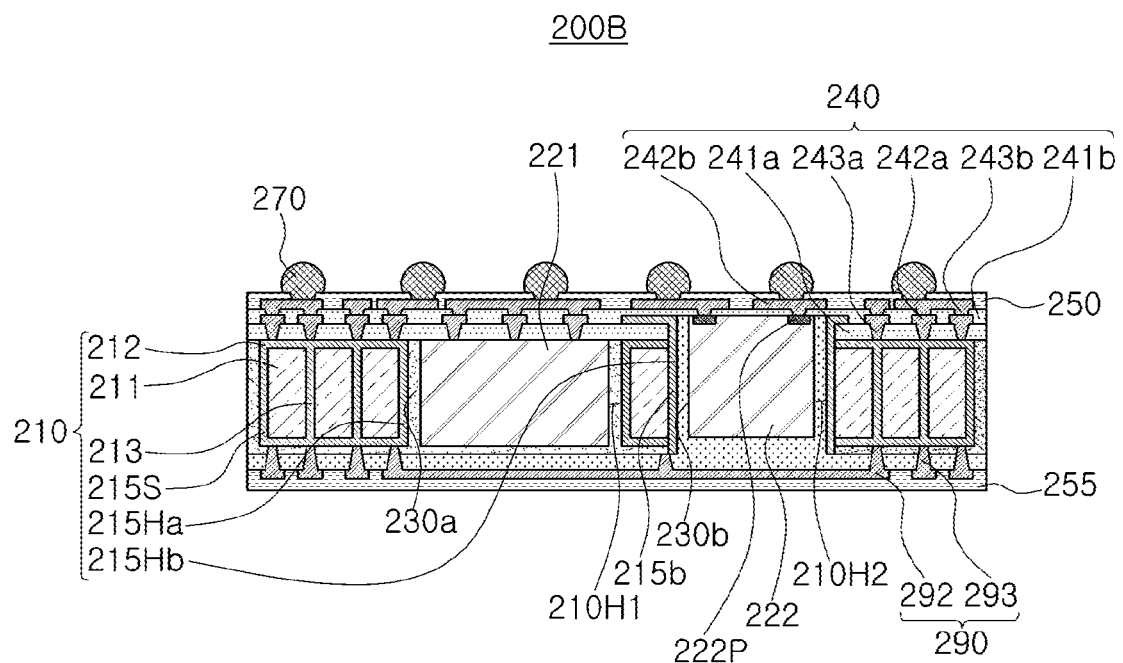
FIG. 16 is schematic cross-sectional view illustrating another example of a semiconductor package.

FIG. 16 is a schematic cross-sectional view illustrating another example of a semiconductor package.

Referring to FIG. 16, in a semiconductor package 200B according to another example, a backside wiring structure 290 may include a backside wiring layer 292 and a backside via 293. That is, the semiconductor package 200B may include a backside wiring layer 292 on the second encapsulant 230b and a backside via 293 penetrating the first and second encapsulants 230a and 230b to connect the backside wiring layer 292 and the wiring layer 212 of the frame 210. At least of a portion of the backside via 293 adjacent to lower surfaces of the electronic component 221 and the semiconductor chip 222 may be a line via or trench via extended along an edge of the electronic component 221 and the semiconductor chip 222 in a direction not illustrated. In addition, in the semiconductor package 200B, the upper and lower surfaces of the insulating layer 211 may be completely covered with the wiring layer 212. Therefore, the insulating layer 211 of the frame 210 may be completely surrounded by the siring layer 212 and the metal layers 215S, 215Ha, and 215Hb. The descriptions for the other configurations or manufacturing methods are substantively the same as in the description of the semiconductor package 200A according to the above-described example.

Figure 17:
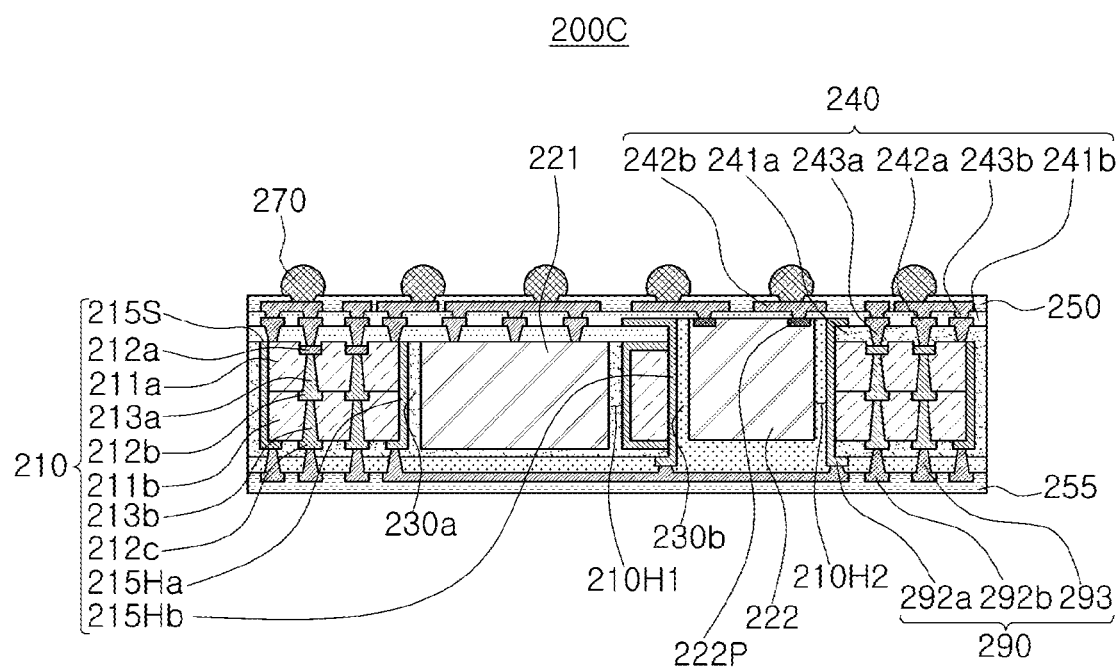
FIG. 17 is a schematic cross-sectional view illustrating another example of a semiconductor package.

FIG. 17 is a schematic cross-sectional view illustrating another example of a semiconductor package.

Referring to FIG. 17, in a semiconductor package 200C according to another example, a frame 210 may include a first insulating layer 211a contacting a connection member 240, a first wiring layer 212a contacting the connection member 240 and embedded in the first insulating layer 211a, a second wiring layer 212b disposed on an opposite side of an area of the first insulating layer 211a in which the first wiring layer 212a is embedded, a second insulating layer 211b disposed on the first insulating layer 211a and covering the second wiring layer 212b, and a third wiring layer 212c disposed on the second insulating layer 211b. As the frame 210 includes a larger number of the wiring layers 212a, 212b, and 212c, the connection member 240 may be further simplified. Accordingly, yield degradation caused by defects occurring in the process of forming the connection member 240 may be resolved. Meanwhile, the first to third wiring layers 212a, 212b, and 212c may be electrically connected to the connection pad 222P. The first and second wiring layers 212a and 212b and the second and third wiring layers 212b and 212c may be electrically connected through the first and second vias 213a and 213b penetrating the first and second insulating layers 211a and 211b, respectively.

The first wiring layer 212a may be recessed internally of the first insulating layer 211a. In the case in which the first wiring layer 212a is recessed internally of the first insulating layer 211a as described above, such that a lower surface of the first insulating layer 211a and a lower surface of the first wiring layer 212a have stepped portions, pollution of the first wiring layer 212a caused by bleeding of the material of the first encapsulant 230a may be prevented. Thickness of the wiring layers 212a, 212b, and 212c of the frame 210 may be greater than that of a redistribution layer 242 of the connection member 240.

When a hole for the first via 213a is formed, some of pads of the first wiring layer 212a may serve as a stopper. Thus, it may be favorable to configure the first via 213a to have a tapered shape in which a width of an upper surface of the first via 213a is greater than that of a lower surface in terms of process. In this case, the first via 213a may be integrated with a pad pattern of the second wiring layer 212b. Also, when a hole for the second via 213b is formed, some of pads of the second wiring layer 212b may serve as a stopper, and thus, it may also be favorable to configure the second via 213b to have a tapered shape in which a width of an upper surface of the second via 213b is greater than that of a lower surface in terms of process. In this case, the second via 213b may be integrated with a pad pattern of the third wiring layer 212c. The descriptions of the other components may substantively the same as in the description of the semiconductor package 200A as described above. Therefore, the detailed description thereof will be omitted.

Figure 18:
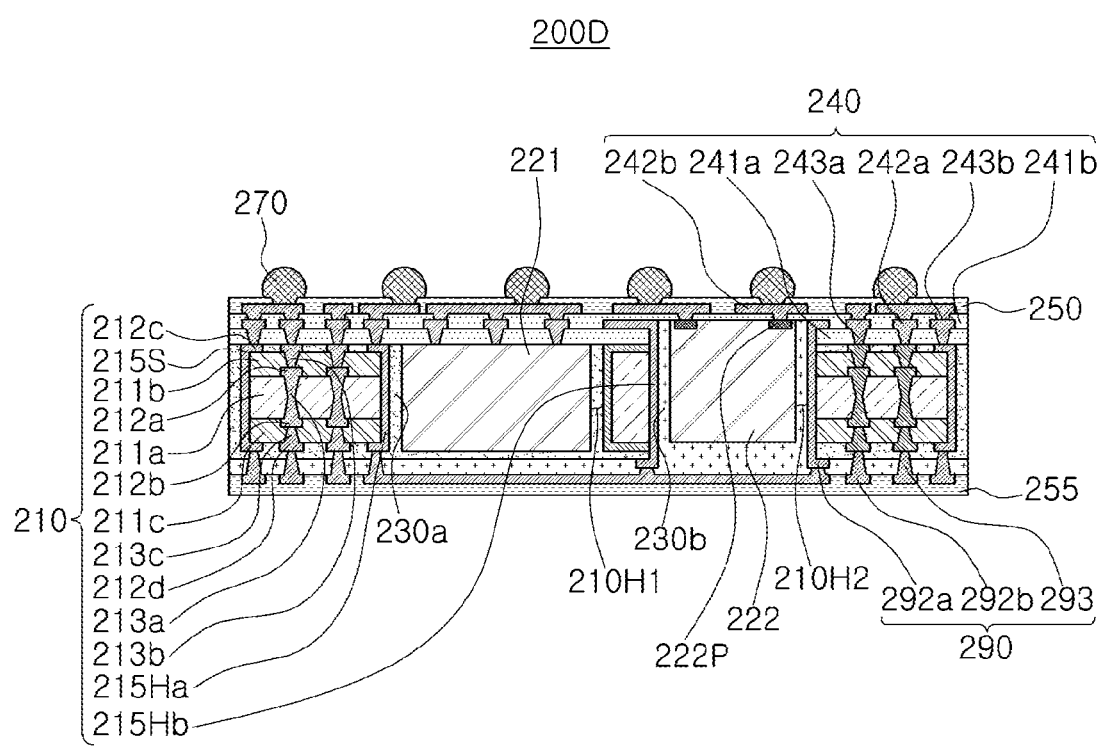
FIG. 18 is a schematic cross-sectional view illustrating another example of a semiconductor package.

FIG. 18 is a schematic cross-sectional view illustrating another example of a semiconductor package.

Referring to FIG. 18, in a semiconductor package 200D according to another example, a frame 210 may include a first insulating layer 211a, a first wiring layer 212a and a second wiring layer 212b disposed on both surfaces of the first insulating layer 211a, a second insulating layer 211b disposed on the first insulating layer 212a and covering the first wiring layer 212a, a third redistribution layer 212c disposed on the second insulating layer 211b, a third insulating layer 211c disposed on the first insulating layer 211a and covering the second wiring layer 212b, and a fourth wiring layer 212d disposed on the third insulating layer 211c. As the frame 210 includes a larger number of the wiring layers 212a, 212b, and 212c, and 212d, the connection member 240 may be further simplified. Accordingly, yield degradation caused by defects occurring in the process of forming the connection member 240 may be resolved. Meanwhile, the first to fourth wiring layers 212a, 212b, 212c, and 212d may be electrically connected through the first to third vias 213a, 213b, and 213c penetrating the first to third insulating vias 211a, 211b, and 211c, respectively.

A thickness of the first insulating layer 211a may be greater than those of the second and third insulating layers 211b and 211c. Basically, the first insulating layer 211a may have a relatively large thickness to maintain stiffness, and the second and third insulating layers 211b and 211c may be introduced to form a larger number of wiring layers 212c and 212d. The first insulating layer 211a may include an insulating material different from those of the second insulating layer 211b and the third insulating layer 211c. For example, the first insulating layer 211a may be, for example, a prepreg including a core, a filler, and an insulating resin, and the second and third insulating layers 211b and 211c may be an ABF film or a PID film including a filler and an insulating resin, but are not limited thereto. Similarly, the first via 213a penetrating the first insulating layer 211a may have a diameter greater than those of the second and third vias penetrating the second and third insulating layers 213b and 213c. Thicknesses of the wiring layers 212a, 212b, 212c, and 212d of the frame 210 may be greater than that of a redistribution layer 242 of the connection member 240. The detailed descriptions of the other components is the substantially the same as that described in the semiconductor package 200A described above. Therefore, the detailed description thereof will be omitted.

As set forth above, according to the exemplary embodiments in the present disclosure a semiconductor package and an antenna module including the same having improved electrical shielding between a through via and a semiconductor chip may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a frame having a first through-hole;
   a semiconductor chip having an active surface on which a connection pad is disposed and an inactive surface disposed on an opposite side of the active surface, and disposed in the first through-hole of the frame with the active surface facing upwards;
   a first encapsulant encapsulating at least a portion of the semiconductor chip;
   a second encapsulant disposed on a portion of an external side wall of the frame; and
   a connection member disposed on the active surface of the semiconductor chip and including a redistribution layer electrically connected to the connection pad of the semiconductor chip,
   wherein the frame includes an insulating layer, a wiring layer on upper and lower surfaces of the insulating layer, a first metal layer on an external side wall of the insulating layer that surrounds the insulating layer, a second metal layer on an internal side wall of the first through-hole, and a via penetrating the upper and lower surfaces of the insulating layer.

2. The semiconductor package of claim 1, wherein at least a portion of the first metal layer is exposed between the first and second encapsulants at a periphery of the frame.

3. The semiconductor package of claim 1, wherein the first metal layer comprises first and second side surface layers, disposed to be overlapped in some portions along the external side wall of the insulating layer and to be in contact with each other.

4. The semiconductor package of claim 1, wherein the first and second encapsulants are alternately disposed on the external side wall of the frame.

5. A semiconductor package comprising:
   a frame having a first through-hole;
   a semiconductor chip having an active surface on which a connection pad is disposed and an inactive surface disposed on an opposite side of the active surface, and disposed in the first through-hole of the frame with the active surface facing upwards;
   a first encapsulant encapsulating at least a portion of the semiconductor chip;
   a second encapsulant disposed on a portion of an external side wall of the frame; and
   a connection member disposed on the active surface of the semiconductor chip and including a redistribution layer electrically connected to the connection pad of the semiconductor chip,
   wherein the frame includes an insulating layer, a wiring layer on upper and lower surfaces of the insulating layer, a first metal layer on an external side wall of the insulating layer, a second metal layer on an internal side wall of the first through-hole, and a via penetrating the upper and lower surfaces of the insulating layer, and
   wherein the first and second encapsulants have different widths on the external side wall of the frame.

6. The semiconductor package of claim 1, wherein the insulating layer is covered by the first and second metal layers on all side walls of the insulating layer.

7. The semiconductor package of claim 1, wherein the frame further has a second through-hole,
   the semiconductor package further comprising an electronic component disposed in the second through-hole and including at least one of a second semiconductor chip and a passive component,
   wherein the second encapsulant encapsulates at least a portion of the electronic component.

8. The semiconductor package of claim 7, wherein the second metal layer comprises first and second through-hole metal layers disposed on the internal side wall of the first through-hole and the internal side wall of the second through-hole.

9. The semiconductor package of claim 8, wherein the first through-hole metal layer extends to a side surface of the second encapsulant.

10. The semiconductor package of claim 8, wherein the connection member comprises a redistribution insulating layer on the active surface of the semiconductor chip, the redistribution layer on the redistribution insulating layer, and a redistribution via penetrating the redistribution insulating layer to be connected to the connection pad of the semiconductor chip, and
    the first through-hole metal layer extends to a side surface of the redistribution insulating layer of the connection member.

11. The semiconductor package of claim 8, wherein the second through-hole metal layer is connected to the wiring layer of the frame.

12. The semiconductor package of claim 1, further comprising a backside via penetrating the first and second encapsulants to be connected to the wiring layer of the frame; and
    a backside wiring layer disposed on the backside via.

13. The semiconductor package of claim 12, wherein a portion of the backside wiring layer is disposed to cover the inactive surface of the semiconductor chip.

14. An antenna module comprising:
an antenna substrate including an antenna pattern; and
a semiconductor package disposed on a lower surface of the antenna substrate to be electrically connected to the antenna substrate,
wherein the semiconductor package includes:
a frame having a first through-hole;
a semiconductor chip having an active surface on which a connection pad is disposed and an inactive surface disposed on an opposite side of the active surface, and disposed in the first through-hole of the frame with the active surface facing upwards;
a first encapsulant encapsulating at least a portion of the semiconductor chip;
a second encapsulant disposed on a portion of an external side wall of the frame; and
a connection member disposed on the active surface of the semiconductor chip and including a redistribution layer electrically connected to the connection pad of the semiconductor chip,
wherein the frame includes an insulating layer, a wiring layer on upper and lower surfaces of the insulating layer, a first metal layer on an external side wall of the insulating layer that surrounds the insulating layer, a second metal layer on an internal side wall of the first through-hole, and a via penetrating the upper and lower surfaces of the insulating layer.

15. The antenna module of claim 14, wherein the via of the frame is disposed on an external side of the semiconductor chip between the first and second metal layers.

16. The antenna module of claim 14, wherein first metal layer forms at least one step along the external side wall of the insulating layer in some portions.

\* \* \* \* \*